United States Patent [19]

Williams et al.

[11] Patent Number: 5,654,574

[45] Date of Patent: Aug. 5, 1997

[54] ELECTROSTATIC DISCHARGE PROTECTION DEVICE FOR INTEGRATED CIRCUIT

[75] Inventors: Richard K. Williams, Cupertino, Calif.; Peter Hille, Darmstadt, Germany; Robert G. Wrathall, Scotts Valley, Calif.

[73] Assignee: Siliconix incorporated, Santa Clara, Calif.

[21] Appl. No.: 486,280

[22] Filed: Jun. 6, 1995

Related U.S. Application Data

[62] Division of Ser. No. 326,172, Oct. 19, 1994, Pat. No. 5,545,909.

[51] Int. Cl.[6] .................................................. H01L 23/62
[52] U.S. Cl. .......................... 257/355; 257/173; 257/327; 257/360; 257/357; 361/56; 361/91; 361/111; 327/313
[58] Field of Search ............................... 257/173, 327, 257/355, 357, 360; 361/56, 91, 111; 327/313

[56] References Cited

U.S. PATENT DOCUMENTS 5,060,037  10/1991  Rountree ............................ 257/357

FOREIGN PATENT DOCUMENTS

0401410A1  12/1990  European Pat. Off. .

OTHER PUBLICATIONS

Radio Fernsehen Electronik, vol. 42, No. 2, pp. 61, Xp 000407295 'Announcement' Feb. 1, 1993.

*Primary Examiner*—Edward Wojciechowicz
*Attorney, Agent, or Firm*—Skjerven, Morrill, MacPherson, Franklin & Friel; David E. Steuber

[57] ABSTRACT

An electrostatic discharge (ESD) device includes a pair of depletion mode MOSFETs connected drain-to-drain in a series path between an input terminal and an output terminal, the gate of each MOSFET being connected to its source. A first diode having a relatively high breakdown voltage is connected between ground and the common drain terminal of the MOSFETs, and a second diode having a relatively low breakdown voltage is connected between ground and the output terminal of the device. The second diode breaks down during a relatively low, long-lived voltage spike (in an automobile, sometimes referred to as a "load dump"), while the second MOSFET saturates, limiting the size of the current through the second diode. The first diode breaks down during a large voltage spike of short duration, such as occurs from an ESD.

26 Claims, 25 Drawing Sheets

$$I_{D4} \approx \frac{(BV_{D3} + I_{D3}R_{D3}) - BV_{D2} - BV_{D4}}{R1} \approx \frac{V_{IN} - BV_{D2} - BV_{D4}}{R1}$$

ELECTROSTATIC DISCHARGE PROTECTION DEVICE FOR INTEGRATED CIRCUIT

CROSS REFERENCE TO RELATED APPLICATION

This application is a division of application Ser. No. 08/326,172, filed Oct. 19, 1994, now U.S. Pat. No. 5,545,904 issued Aug. 13, 1996.

This application is related to application Ser. No. 08/325,860, entitled "Protective Circuit For Protecting Load Against Excessive Input Voltage", now U.S. Pat. No. 5,585,991, issued on Dec. 17, 1996, which is incorporated herein by reference in its entirety.

FIELD OF THE INVENTION

This invention relates to electrostatic discharge protective devices and, in particular, an electrostatic discharge protective device for protecting an integrated circuit device in an automobile against a condition known as "load dump".

BACKGROUND OF THE INVENTION

The input pins to an integrated circuit device are highly sensitive to damage from electrostatic discharge (ESD). An electrostatic charge may reach potentials in excess of hundreds of volts. If a charge of this magnitude is brought into contact with a pin of an integrated circuit (IC) device, a large flow of current may surge through the device. Although this current surge may be of limited energy and duration, it may nonetheless rupture the thin gate oxide in a MOS device or damage a diffused PN junction if the junction is of limited area. In the latter case, the damage occurs because the current surge leads to localized heating which may melt metal interconnects or alloy metal through the junction. Once an IC is damaged, it is impossible to repair it.

In conventional integrated circuits, damaging ESD pulses are prevented by the use of protective circuitry at the input to the device. This protective circuitry is typically constructed of one or two PN diodes of substantial area or, alternatively, a bipolar transistor or thyristor. When the voltage at the input exceeds a specified range in either a positive or negative polarity, one of the diodes conducts and thereby clamps the voltage at the pin to a safe level. The effectiveness of the ESD protection requires that the diode not be exposed to substantial currents during the application of normal input signals to the IC device.

FIG. 1A illustrates an equivalent circuit for a common ESD protection arrangement. The input terminal of the circuit is connected to an input pin, and the output terminal is connected to the internal circuitry of the IC device. A diode $D_A$ has its anode connected to ground and its cathode connected to a line 10 connecting the input and output terminals. A diode $D_B$ has its anode connected to line 10 and its cathode connected to the supply voltage $V_{CC}$.

The operation of this circuit is illustrated in FIG. 1B, wherein $V_{IN}$ is the voltage at the input terminal and $V_{OUT}$ is the voltage at the output terminal. If $V_{IN}$ exceeds the supply voltage $V_{CC}$ plus a diode drop (approximately 0.7 V), diode $D_B$ becomes forward-biased and clamps $V_{OUT}$ to this level. This is illustrated by curve A in FIG. 1A. This assumes that the device is operative, with the supply voltage $V_{CC}$ connected. If $V_{CC}$ is not connected, at some point diode $D_A$ will break down and thereby clamp the voltage at the output terminal. This is represented by curve B in FIG. 1B, with $BV_{DA}$ representing the breakdown voltage of diode $D_A$.

A negative voltage spike at the input terminal will cause diode $D_A$ to forward-bias when it falls below approximately 0.7 volts. This is shown by curve C in FIG. 1B. If the negative spike occurs between a pin connected to $V_{CC}$ and the input pin, diode $D_B$ will become reverse-biased and break down at its breakdown voltage $BV_{DS}$, as illustrated by curve D in FIG. 1B.

The net result is that, provided $V_{CC}$ is maintained at a positive voltage above ground (typically 5 or 12 V), an input voltage can pass through the ESD protection circuit unimpaired. In FIG. 1B this is reflected by the linear relationship between $V_{IN}$ and $V_{OUT}$ over a range from 0V to $V_{CC}$. In this region the only effect of the protective circuitry may be to create some capacitive loading.

During an ESD pulse, rapid heating occurs in the diode. If the area of the diode is too small, a significant and potentially fatal temperature rise may occur. Destruction through heating generally occurs as a result of melting the metalization or the formation of alloy spikes which short out the diode's junction. By increasing the size of the diode, a peak junction temperature of 200° C. can easily be reduced to 90° C. for a 2000 V ESD pulse.

An ESD pulse may be modeled as a discharge of a capacitor precharged to a given voltage. The discharge occurs through a resistance whose value varies with the particular situation which the model is intended to represent. For example, if the discharge occurs from a human body, the resistance is approximately 2000 ohms. If the electrostatic charge is built up in a machine or tool (e.g., a screw driver), the resistance is essentially zero. In the absence of any series resistance, in the machine model the magnitude of the discharge must be kept below about 500V or excessive current will result. While this current may be limited by an internal series resistor, all IC processes implement resistors as either a diffusion or as a region surrounded by oxide. Diffused resistors in general include parasitic transistors which may compromise the ESD diode performance. Resistors surrounded by oxides such as those made in polysilicon have the problem of overheating during electrostatic discharge, since the oxide surrounding them has poor thermal conductivity. In fact, a resistor will generally blow out, like a fuse, and protect an ESD diode.

The maximum output voltage of an ESD circuit must remain below the allowable voltage of the input stage of the circuit to which it is connected. If the input stage is tied to the base of a bipolar transistor, for example, $V_{OUT}$ must be clamped below the base-to-emitter breakdown voltage, or the transistor may break down, and its performance may be degraded. If the input stage is connected to the gate of a MOSFET, $V_{OUT}$ should stay below 50% of the oxide rupture voltage (around 4 MV/cm). For a 400 Å thick gate, for example, the voltage $V_{OUT}$ should be clamped to approximately 16V. Beyond this voltage some degradation may be observed. If the voltage across the gate oxide exceeds 8 to 10 MV/cm, the MOSFET will be permanently damaged.

The foregoing techniques rely on the ability of the diodes to absorb the energy of an ESD pulse. The diodes clamp the voltage to a safe level and do not burn out only because the total energy in the ESD pulse is limited. For pulses of longer durations, approaching a DC condition, overheating and damage will generally result. The higher the input voltage, the more rapidly the diodes will overheat and self-destruct. Thus, while conventional ESD protective circuits are able to withstand ESD pulses of thousands of volts, the duration of the pulse must be very short (measured in nanoseconds), or the diodes in the protective circuitry will burn out.

In some environments an IC device may be subjected to an over-voltage condition for a longer period of time. This is particularly true in an automobile, where a condition known as "load dump" can occur. Load dump occurs when the alternator is charging a discharged battery which has a loose cable. So long as the cable is connected, the battery appears as a short circuit to the alternator, and the alternator delivers a large current. If the automobile hits a bump, for example, and jars the cable loose, this large current is suddenly cut off (i.e., there is a high dI/dt). This abrupt change in current creates a large burst of voltage from the alternator as a result of inductance. The magnitude and duration of this voltage burst are high enough that every electronic load connected directly to the battery cable will be destroyed unless some special protection is employed. The voltage burst from a load dump may rise to 60V for hundreds of milliseconds.

The supply input to an IC must be able to survive the voltage transients which accompany a load dump. Moreover, even some of the signal inputs to the IC may be connected, directly or indirectly, to the battery line, and these inputs may likewise be subjected to the load dump condition.

A comparison between a normal ESD spike and a load dump is illustrated in FIGS. 2A–2C. The horizontal axis on each of these figures is time. As shown in FIG. 2A, an ESD pulse is very short lived but may reach a magnitude of thousands of volts. On the other hand, a load dump may reach a magnitude of, for example, 60V but is relatively long in duration. FIG. 2B illustrates the result of clamping an ESD pulse and a load dump to 15V with an ordinary diode. FIG. 2C illustrates the temperature of the diode. As shown, the ESD pulse results in a sharp temperature increase to as high as 200° C., but the short duration of the pulse prevents the temperature from destroying the diode. In contrast, the load dump causes the temperature to increase over a much longer period of time and will ultimately destroy the diode.

The load dump condition thus places unique requirements on the ESD protection circuitry. If the diodes are fabricated such that they do not conduct during the load dump (e.g., 60V), they will not provide adequate protection during electrostatic discharge (since they will allow the voltage in the IC to rise to 60V). On the other hand, if the diodes are made to break down at 15V, thereby protecting the IC against ESD, they will burn out during a load dump.

Accordingly, what is needed is an ESD structure which will clamp the voltage on an input pin to some low voltage (e.g., 5 to 15V) during a short ESD pulse, but will not result in excess current during the application of, say, 60V for extended periods of time. Such a structure would be useful as a load dump-compatible ESD protection circuit for integrated circuits used in automotive environments.

SUMMARY OF THE INVENTION

A protective circuit according to this invention satisfies all of these requirements. A depletion mode MOSFET is connected between the input and output terminals of the ESD protection circuit. A diode is connected between ground and the line connecting the input and output terminals. In the event of a load dump, the depletion load MOSFET acts as a constant current source which limits the flow of current through the diode. In this manner, the diode is protected against large, sustained currents which would burn it out. In the presence of an ordinary ESD pulse, the "anti-parallel" diode within the depletion mode MOSFET is typically broken down, and the grounded diode clamps the output voltage to an acceptable level.

In the preferred embodiment, two depletion mode MOSFETs are serially connected drain-to-drain in the line between the input and output terminals. The cathode of the grounded diode is connected to the common junction of the drain terminals of the two depletion mode MOSFETs. A second grounded diode is connected to the output terminal. The preferred embodiment protects against both positive and negative going ESD pulses as well as positive and negative voltages resulting from a load dump.

A protective circuit according to this invention may be connected to either a signal input pin or a power supply pin. In the latter case, the portion of the circuitry designed to protect against negative voltages may be omitted.

DESCRIPTION OF THE INVENTION

As described above, an ESD protection circuit according to this invention relies on the current limiting ability of a depletion mode MOSFET. A depletion mode MOSFET is a MOSFET which is normally turned on (i.e., when the gate-to-source voltage $V_{gs}$ equals 0V). To turn the MOSFET off, $V_{gs}$ must be reduced until the pinch-off voltage is reached. The source and body regions of the MOSFET are typically shorted together, and this results in an intrinsic diode at the PN junction of the body and drain regions which is directed in opposition to the normal current flow in the depletion mode MOSFET. Since this diode is in parallel with the channel region and in opposition to the normal direction of current flow in the MOSFET, it is frequently referred to as an "anti-parallel diode".

Figure 1A:
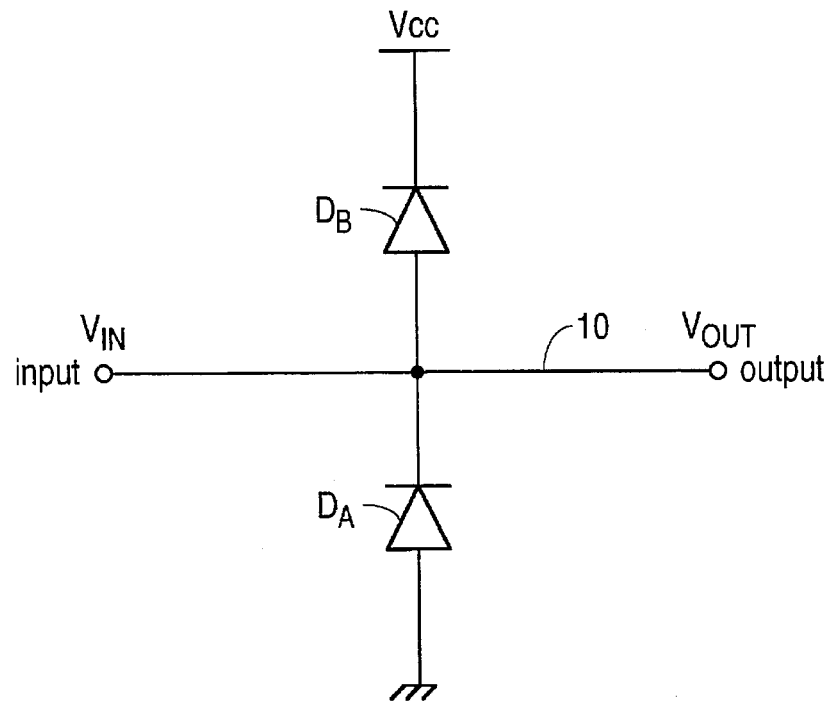
FIG. 1A illustrates a conventional ESD protection circuit and FIG. 1B illustrates the output voltage as a function of the input voltage for the protective circuit.
Figure 1B:
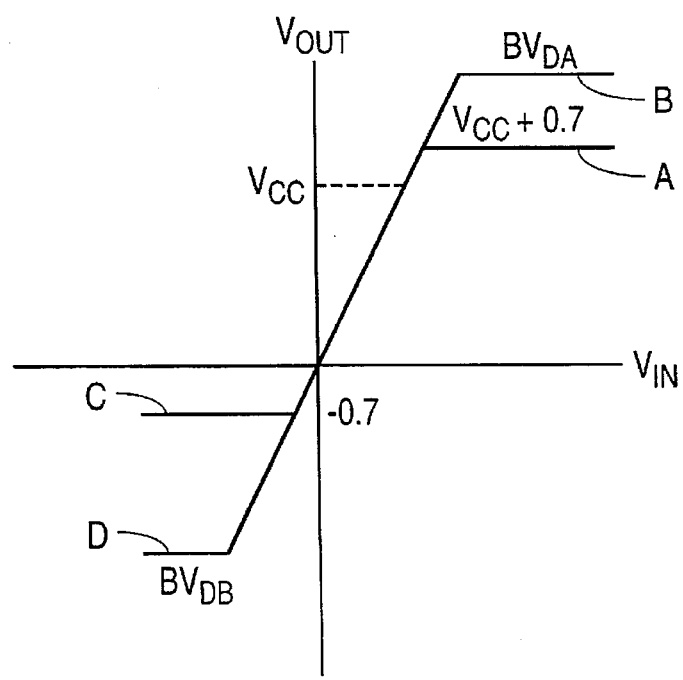
Figure 2A:
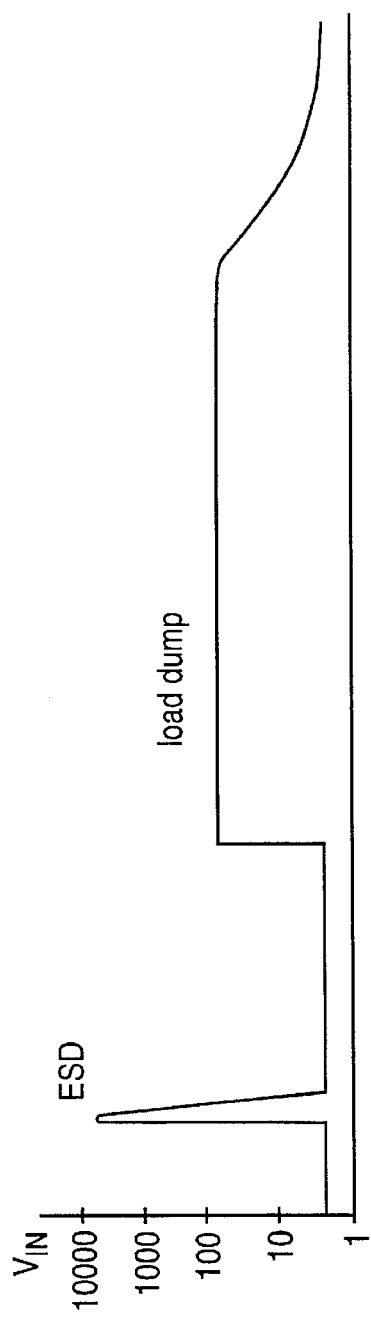
FIGS. 2A–2C illustrate, respectively, the input voltage, the output voltage and the diode temperature for the protective circuit shown in FIG. 1A in the presence of an ESD pulse and a load dump.
Figure 2B:
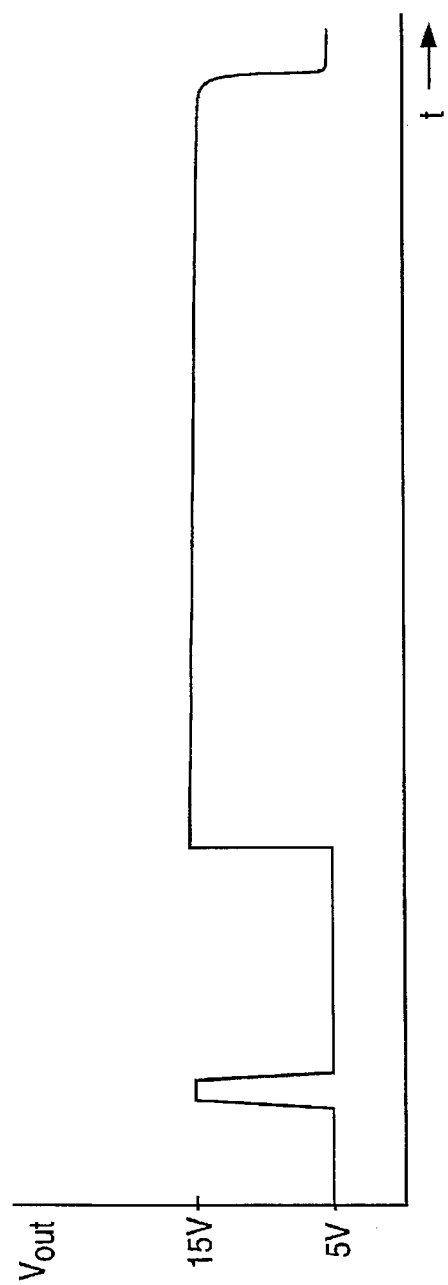
Figure 2C:
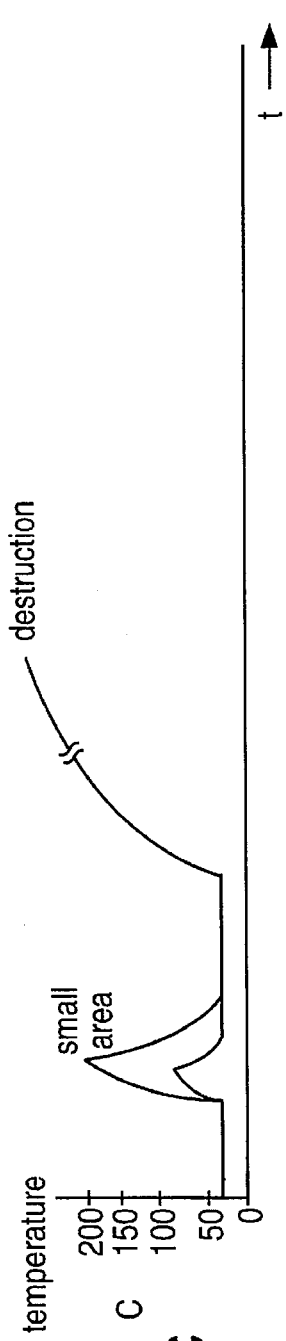
Figure 3:
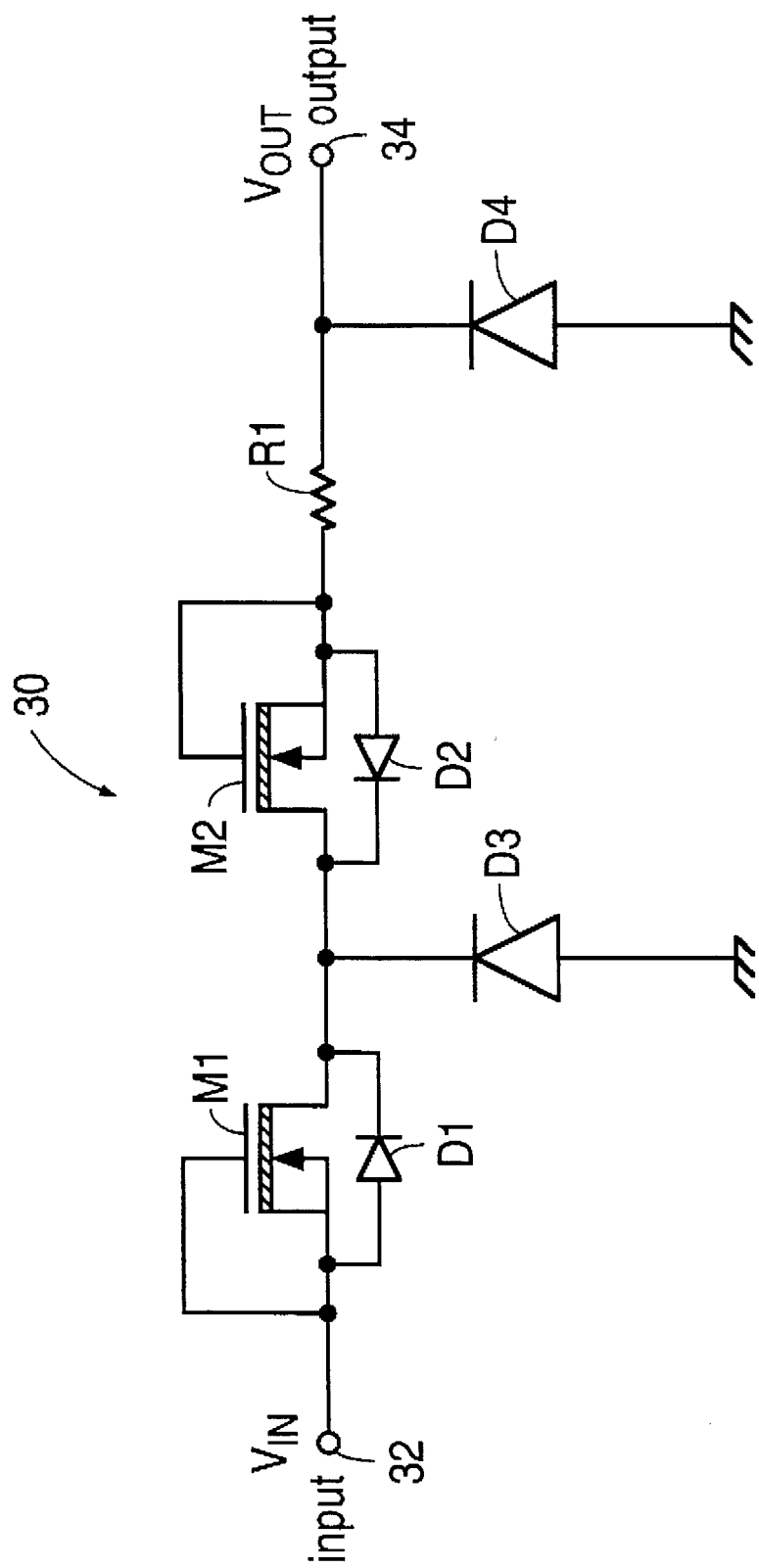
FIG. 3 illustrates a circuit diagram for a preferred ESD protective circuit in accordance with the invention.

FIG. 3 illustrates a preferred embodiment according to the invention. An ESD protection circuit 30 includes high-voltage depletion mode MOSFETs $M_1$ and $M_2$ that are connected between an input terminal 32 and an output terminal 34. As shown, the drain terminals of MOSFETs $M_1$ and $M_2$ are joined together, and the gate terminals of MOSFETs $M_1$ and $M_2$ are tied to their respective source terminals. A resistor $R_1$ is connected in series with MOSFETs $M_1$ and $M_2$. The anti-parallel diodes in depletion mode MOSFETs $M_1$ and $M_2$ (described above) are represented as diodes $D_1$ and $D_2$, respectively. A diode $D_3$ is connected between ground and the common node between the drain terminals of MOSFETs $M_1$ and $M_2$, and a diode $D_4$ is connected between ground and output terminal 34. Diode $D_4$ is a conventional low-voltage ESD diode, whereas diode $D_3$ is a high-voltage diode. Generally speaking, the basic operation of the device uses the low-voltage diode $D_4$ to limit the output voltage $V_{OUT}$ in all circumstances, uses depletion mode MOSFETs $M_1$ and $M_2$ to limit the current through diode $D_4$, and uses the high-voltage diode $D_3$ to absorb the major portion of the energy from a positive or negative going ESD pulse. The MOSFETs $M_1$ and $M_2$ are designed such that, in a load dump condition, any current flowing must flow entirely through at least one if not both of them. MOSFETs $M_1$ and $M_2$ can then be used to limit the current to a safe level during the duration of a load dump. During an ESD pulse, circuit 30 uses either the avalanche breakdown or forward biasing of a diode junction to clamp the output voltage $V_{OUT}$. In this mode of operation, the device operates in a manner similar to conventional ESD protection circuits, but with some notable advantages described later in this specification.

Since MOSFETs $M_1$ and $M_2$ are both depletion mode, they are normally turned on and current flows through them whenever there is a voltage difference between $V_{IN}$ and $V_{OUT}$. Since the anti-parallel diodes $D_1$ and $D_2$ are connected in opposition to each other, current never flows through diodes $D_1$ and $D_2$ in the forward direction at the same time. When the source/body terminal of MOSFET $M_1$ or $M_2$ is biased positively with respect to its drain terminal, current initially flows through the channel region until the voltage difference exceeds around 0.6V. At that point, the anti-parallel diode ($D_1$ or $D_2$) begins to shunt current around the channel.

In an automotive environment, MOSFETs $M_1$ and $M_2$ should be rated at 60V, which means that they would have a breakdown voltage of approximately 70V. The breakdown voltage of MOSFETs $M_1$ and $M_2$ refers to the breakdown of the anti-parallel diodes $D_1$ and $D_2$, respectively. Diode $D_3$ should also have a breakdown voltage of approximately 70V. Since the gates of MOSFETs $M_1$ and $M_2$ are tied to their sources (i.e., $V_{gs}=0$), the only voltage across either of these devices appears between its drain and source-body terminals. If the devices are formed by a DMOS process, high drain voltages do not result in high electric fields across their gate oxides, and MOSFETs $M_1$ and $M_2$ are therefore not subject to ESD damage at their own gate electrodes. Diode $D_4$ is a large perimeter or large area diode with a low voltage breakdown. The breakdown voltage of diode $D_4$ must exceed the maximum input signal (e.g., $V_{CC}$), but not by a wide margin.

Figure 4A:
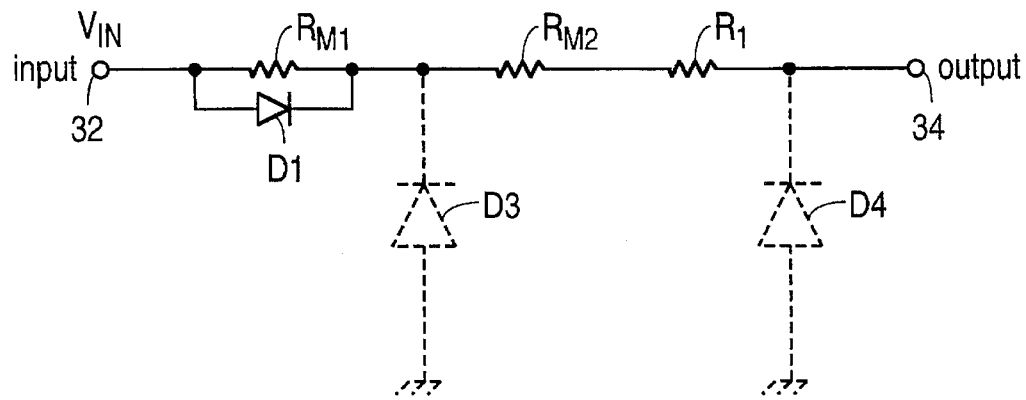
FIGS. 4A–4C illustrate, respectively, an equivalent circuit, the output voltage as a function of the input voltage, and the current to ground as a function of the input voltage for the circuit shown in FIG. 3 when the input voltage is less than about 0.7V.
Figure 4B:
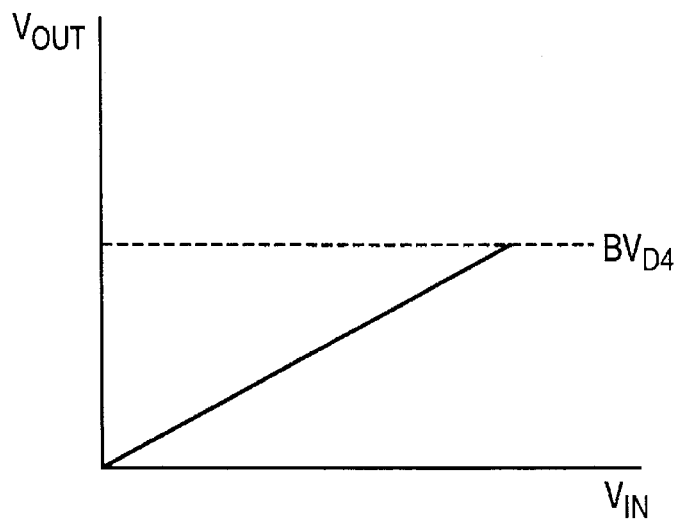
Figure 4C:
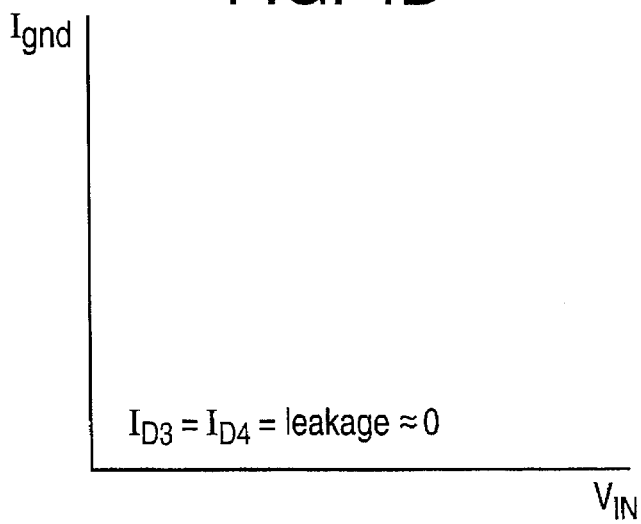

FIGS. 4A–4C, 5, 6A–6C, 7A–7C and 8A–8C illustrate the operation of ESD protection circuit 30 during different stages of a positive voltage transition. Each of the figures illustrates the behavior of circuit 30 within a specified range of $V_{IN}$. FIGS. 4A–4C illustrate the operation of the device when $V_{IN}$ is between 0V and the breakdown voltage of diode $D_4$ ($BV_{D4}$). In this region, diodes $D_3$ and $D_4$ are reverse-biased and essentially non-conductive. As shown in the equivalent circuit of FIG. 4A, MOSFET $M_1$ acts as a resistance $R_{M1}$ in parallel with anti-parallel diode $D_1$, and MOSFET $M_2$ acts as a resistance $R_{M2}$. Therefore, as shown in FIG. 4B, $V_{OUT}$ is a roughly linear function of $V_{IN}$. As shown in FIG. 4C, the leakage current to ground through diodes $D_3$ and $D_4$ approximates zero.

Figure 5:
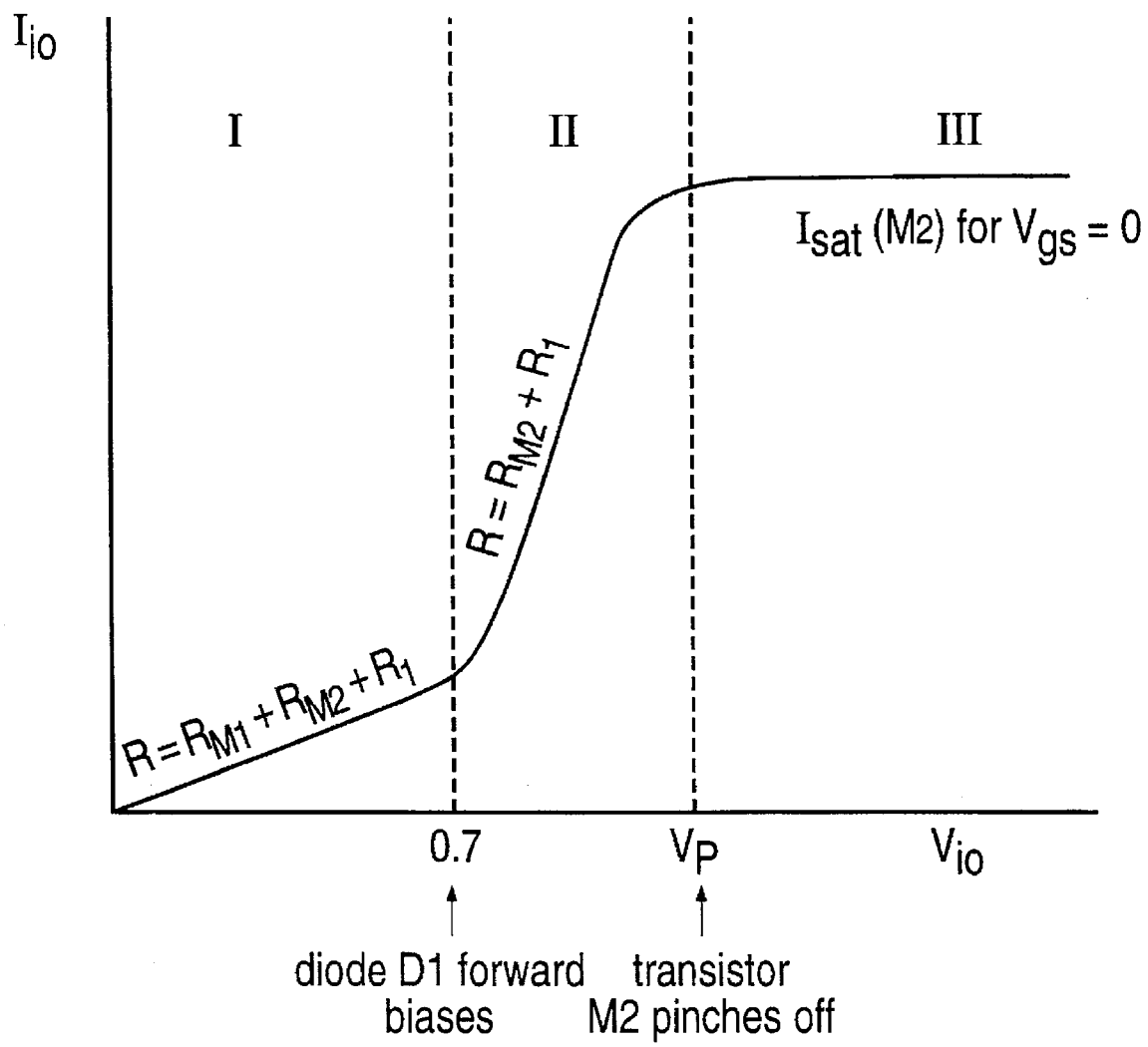
FIG. 5 illustrates the current from the input to the output terminal of the circuit shown in FIG. 3 as a function of the voltage difference between the input and output terminals.

FIG. 5 shows the current from input terminal 32 to output terminal 34 ($I_{io}$) as a function of the voltage drop from input terminal 32 to output terminal 34 ($V_{io}$). In Region I, where $V_{io}$ is less than about 0.7V, the circuit exhibits a series resistance equal to $R_{M1}+R_{M2}$ $R_1$. When $V_{io}$ exceeds about 0.7V, diode $D_1$ may conduct and the series resistance falls to $R_{M2}+R_1$. This is shown as Region II. When $V_{io}$ reaches the pinch-off voltage of MOSFET $M_2$ ($V_p$), MOSFET $M_2$ saturates and acts as a constant current source for increasing voltages within Region III. Unless MOSFET $M_2$ is undersized, protective circuit 30 should not normally operate within Region III.

Figure 6A:
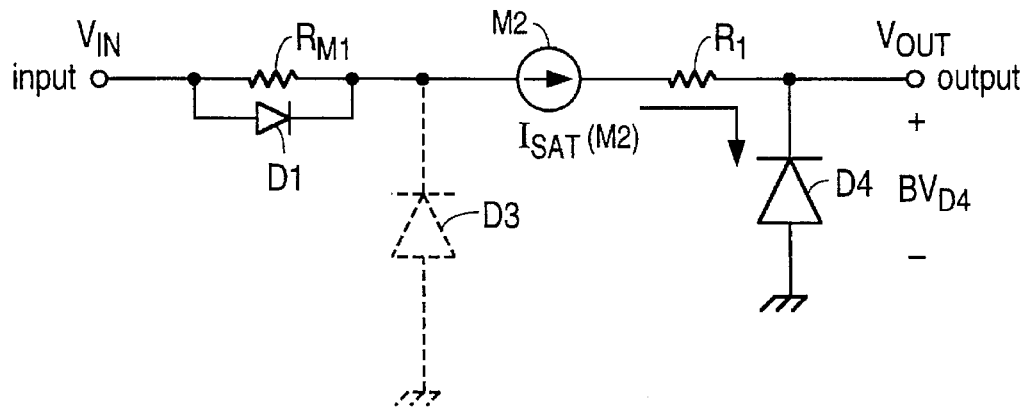
FIGS. 6A–6C illustrate, respectively, an equivalent circuit, the output voltage as a function of the input voltage, and the current to ground as a function of the input voltage for the circuit shown in FIG. 3 when breakdown has occurred in one of the diodes and one of the MOSFETs has saturated.
Figure 6B:
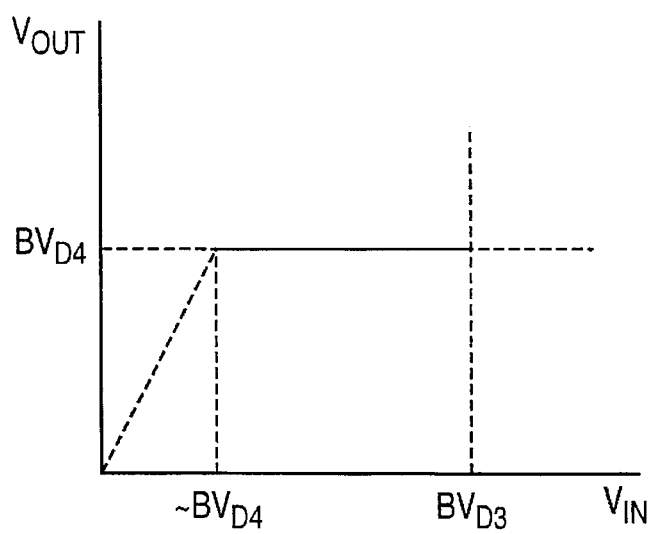
Figure 6C:
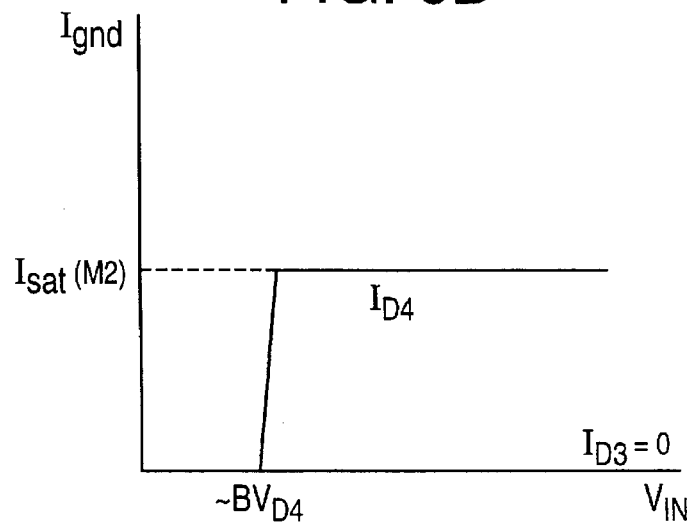

FIGS. 6A–6C illustrate the operation of circuit 30 when $V_{IN}$ exceeds the breakdown voltage of diode $D_4$ ($BV_{D4}$), but does not exceed the breakdown voltages of diodes $D_1$, $D_2$ or $D_3$. In this situation, diode $D_4$ goes into avalanche breakdown and clamps the output voltage to $BV_{D4}$, and MOSFET $M_2$ becomes saturated. This is illustrated in the equivalent circuit of FIG. 6A, which shows MOSFET $M_2$ as a current source and a current flowing in a reverse direction through diode $D_4$ to ground. Since diode $D_3$ has a higher breakdown voltage than diode $D_4$, it remains substantially non-conductive. FIG. 6B shows that $V_{OUT}$ remains essentially constant at $BV_{D4}$ for $V_{IN}$ in the interval between the breakdown voltage of diode $D_4$ and breakdown voltage of diode $D_3$. As shown in FIG. 6C, the current to ground through diode $D_4$ increases rapidly to the saturation current of MOSFET $M_2$ when $V_{IN}$ passes the breakdown voltage of diode $D_4$. With the current flowing through diode $D_4$ limited to $I_{sat}$ ($M_2$), this condition could be maintained nearly indefinitely without burning out diode $D_4$. Assuming that the breakdown voltage of diode $D_3$ is 70V or more, a load dump of 60V could be handled by device 30 without any adverse impact on the IC.

Figure 7A:
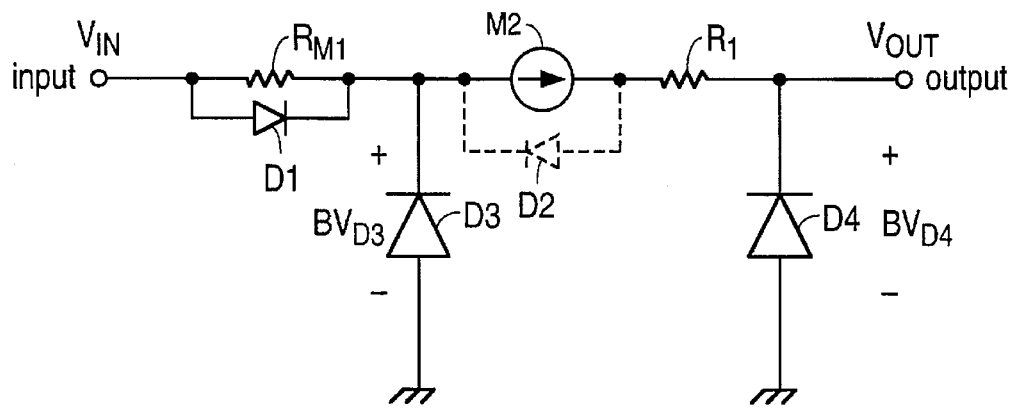
FIGS. 7A–7C illustrate, respectively, an equivalent circuit, the output voltage as a function of the input voltage, and the current to ground as a function of the input voltage for the circuit shown in FIG. 3 when breakdown has occurred in the other diode.
Figure 7B:
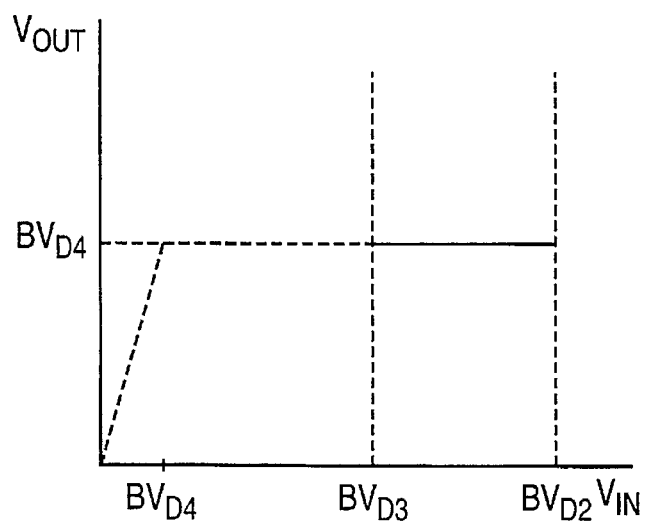
Figure 7C:
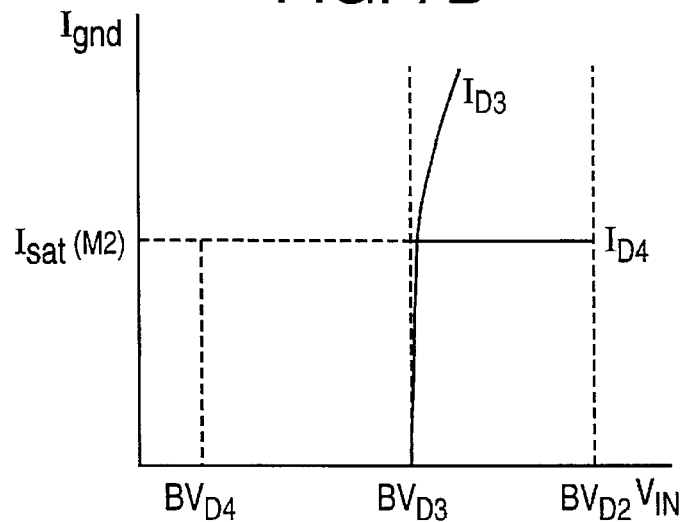

FIGS. 7A–7C illustrate the behavior of circuit 30 when $V_{IN}$ exceeds the breakdown voltage of diode $D_3$ ($BV_{D3}$). This would generally occur from an ESD pulse rather than a load dump. In this situation, diode $D_3$ goes into breakdown and clamps the voltage at $BV_{D3}$ except for any voltage rise resulting from the series resistance of $R_1$ or localized heating. As shown in FIG. 7B, $V_{OUT}$ remains substantially at $BV_{D4}$. On the other hand, as shown in FIG. 7C, the current to ground through diode $D_3$ increases rapidly. The current to ground through diode $D_4$ remains limited to the saturation current of MOSFET $M_2$.

Figure 8A:
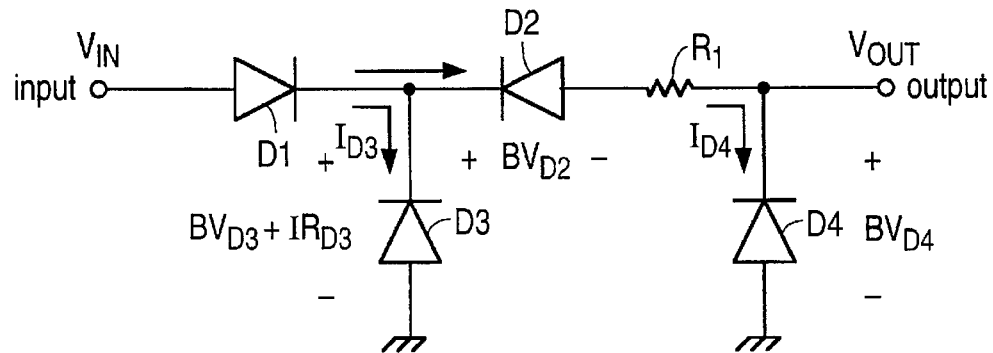
FIGS. 8A–8C illustrate, respectively, an equivalent circuit, the output voltage as a function of the input voltage, and the current to ground as a function of the input voltage for the circuit shown in FIG. 3 after breakdown has occurred in one of the anti-parallel diodes.
Figure 8B:
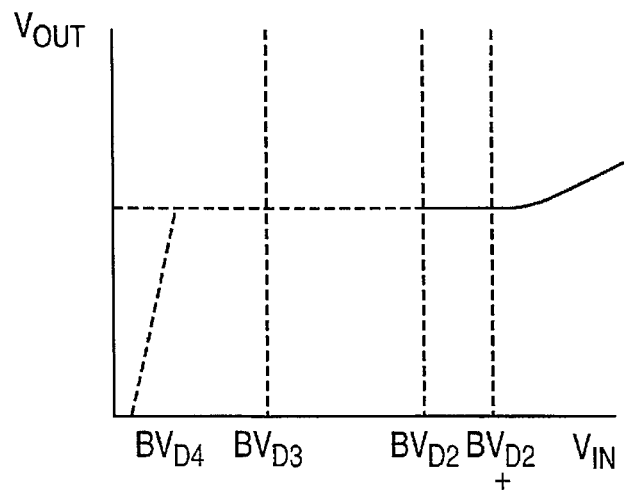
Figure 8C:
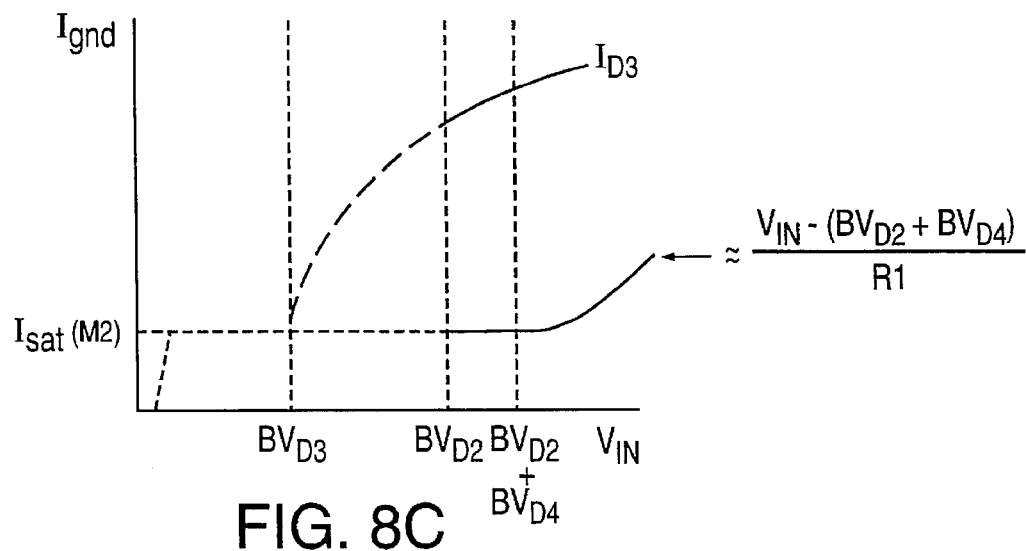

FIGS. 8A–8C illustrate what happens when $V_{IN}$ exceeds the sum of the breakdown voltages of diodes $D_2$ and $D_4$ ($BV_{D2}+BV_{D4}$). Again, this would occur in the presence of an ESD pulse, and when this happens diode $D_3$ should have absorbed a significant percentage of the energy of the ESD pulse. Nonetheless, in this situation diode $D_2$ does break down, and there will be an increase in the voltage across and current through diode $D_4$.

The current through diode $D_4$ ($I_{D4}$) can be approximated as follows:

$$I_{D4} \approx \frac{V_{IN} - BV_{D2} - BV_{D4}}{R_1}$$

For $V_{IN} \gg BV_{D2}+BV_{D4}$, then $$I_{D4} \approx \frac{V_{IN}}{R_1}$$

For a 2000V input and $R_1$=2000 ohm, this current is 1A, but it is of extremely limited duration. The main objective is to make the conduction path through diode $D_3$ more attractive, thereby limiting the output voltage $V_{OUT}$.

Figure 9A:
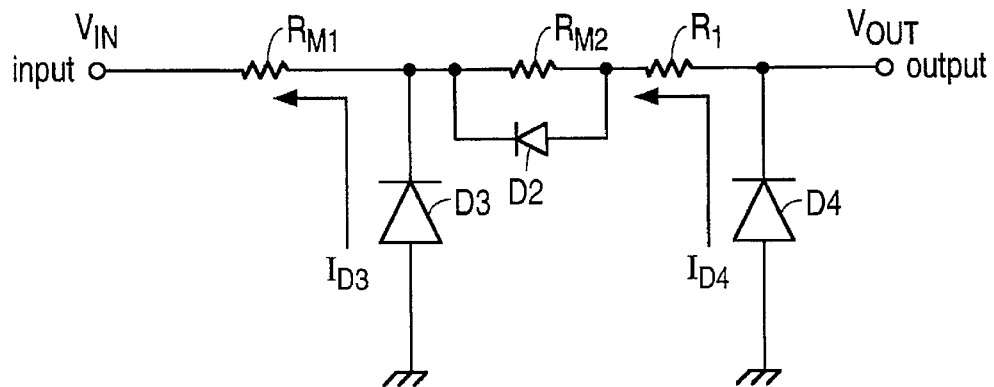
FIGS. 9A–9C illustrate, respectively, an equivalent circuit, the output voltage as a function of the input voltage, and the current to ground as a function of the input voltage for the circuit shown in FIG. 3 in the presence of a negative input pulse before either depletion mode MOSFET has saturated.
Figure 9B:
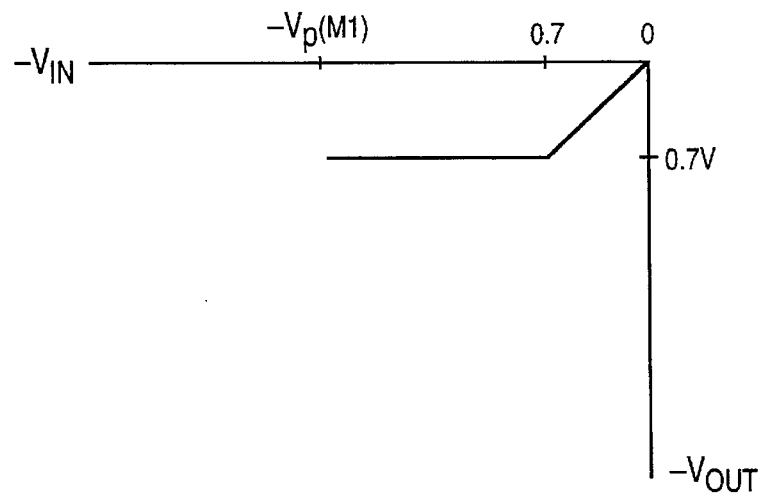
Figure 9C:
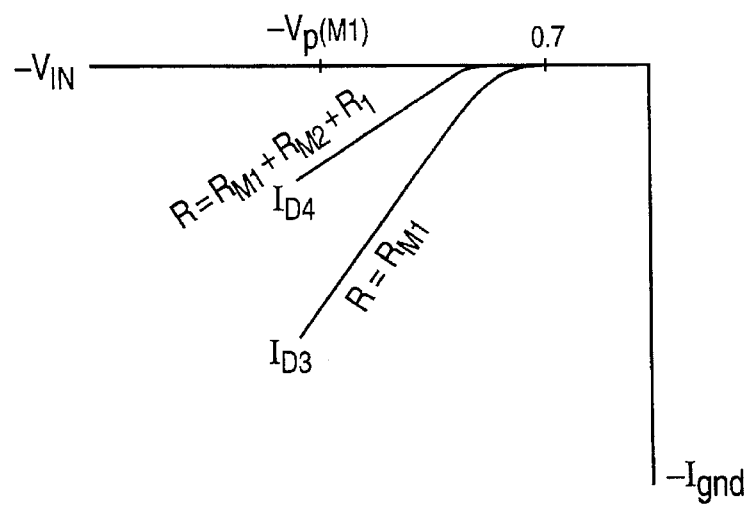

FIGS. 9A–9C, 10A–10C, and 11A–11C illustrate the effect of a negative voltage spike on protective circuit 30. Such spikes, while not specifically due to a load dump, can occur because of intermittent load connections or during a reverse battery connection, and they can last for several days. The basic equivalent circuit for $V_{IN}$ less than 0V but greater than the pinch-off voltage of MOSFET $M_1$ (which has a negative polarity) is illustrated in FIG. 9A. As soon as $V_{IN}$ drops below approximately −0.7V, diodes $D_3$ and $D_4$ turn on and clamp the output voltage. In this range, MOSFET $M_1$ acts as a resistance $R_{M1}$, and MOSFET $M_2$ acts as a resistance $R_{M2}$ in parallel with diode $D_2$. As shown in FIG. 9C, most of the current flows through diode $D_3$, which has a lower resistance than diode $D_4$. In MOSFET $M_2$, the current is divided between the channel and diode $D_2$.

Figure 10A:
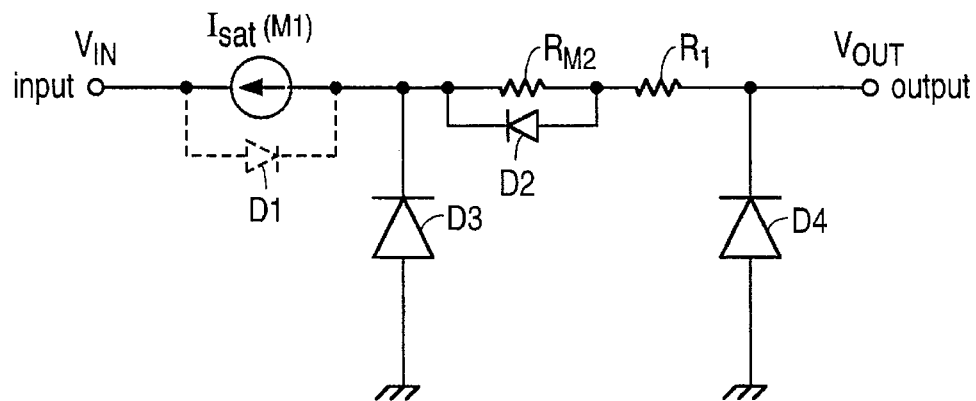
FIGS. 10A–10C illustrate, respectively, an equivalent circuit, the output voltage as a function of the input voltage, and the current to ground as a function of the input voltage for the circuit shown in FIG. 3 in the presence of a negative input pulse after one of the depletion mode MOSFETs has saturated.
Figure 10B:
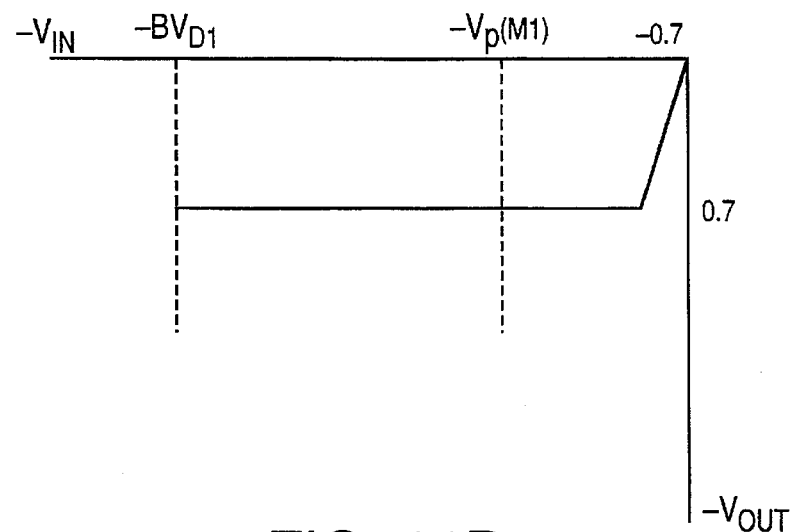
Figure 10C:
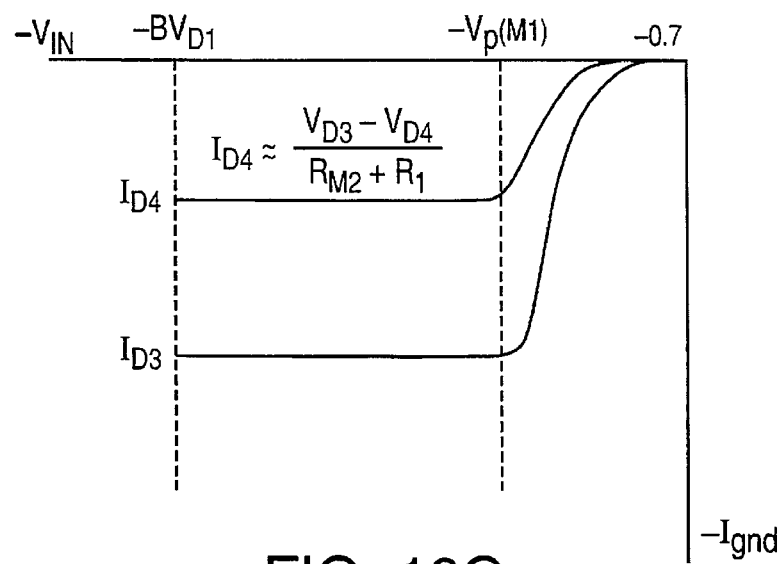

As shown in FIGS. 10A–10C, when the input voltage falls below the (negative) pinch-off voltage of MOSFET $M_1$, MOSFET $M_1$ current saturates and becomes equivalent to a constant current source. This protects both diode $D_3$ and diode $D_4$ from excessive current. This condition prevails so long as $V_{IN}$ does not fall below the breakdown voltage of diode $D_1$ ($BV_{D1}$). If $BV_{D1}$ is selected to be −70V, this means that a −60V voltage spike (sometimes referred to a Shaffner pulse) could be sustained for a long duration or even indefinitely. As shown in FIG. 10B, $V_{OUT}$ remains at −0.7V and, as shown in FIG. 10C, the current through diode $D_3$ ($I_{D3}$) continues to be greater than the current through diode $D_4$ ($I_{D4}$), although both of these currents remain substantially constant within this range.

Figure 11A:
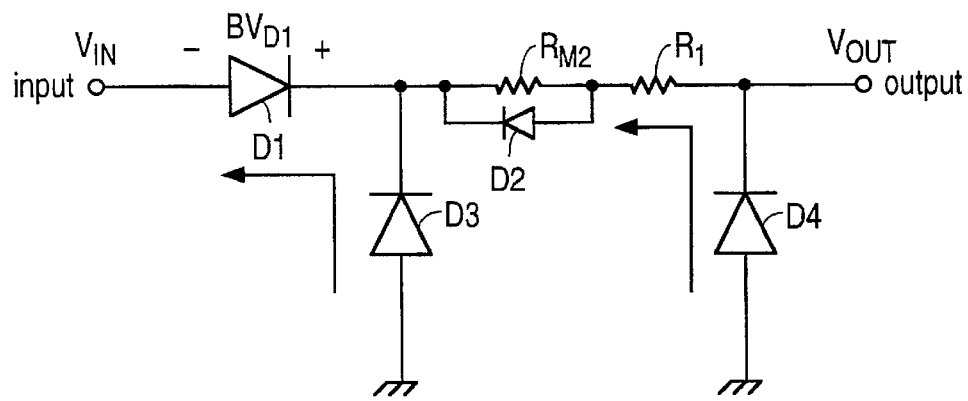
FIGS. 11A–11C illustrate, respectively, an equivalent circuit, the output voltage as a function of the input voltage, and the current to ground as a function of the input voltage for the circuit shown in FIG. 3 in the presence of a negative input pulse after breakdown of the antiparallel diode in one of the depletion mode MOSFETs has occurred.
Figure 11B:
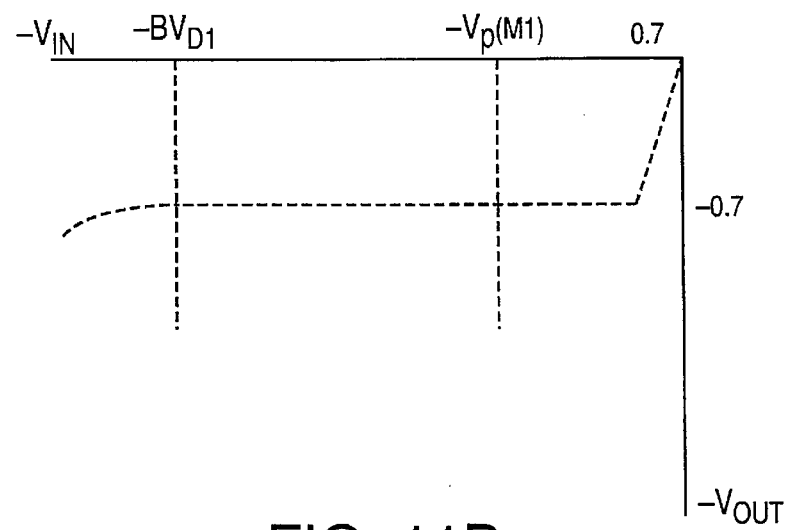
Figure 11C:
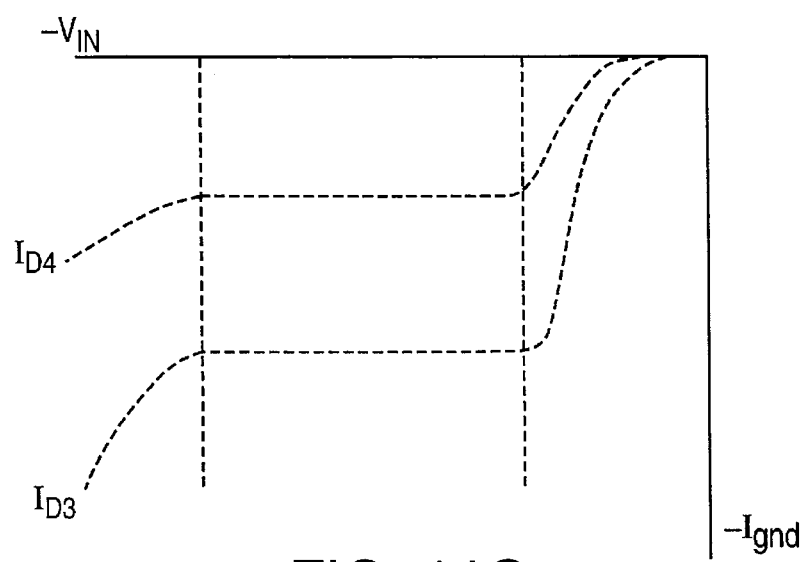

FIGS. 11A–11C illustrate the situation when $V_{IN}$ falls below the breakdown of diode $D_1$. Diode $D_3$ absorbs most of the energy, but diode $D_4$ conducts to a lesser degree. This condition would be encountered in the presence of a negative ESD spike, which would be of short duration.

Figure 12A:
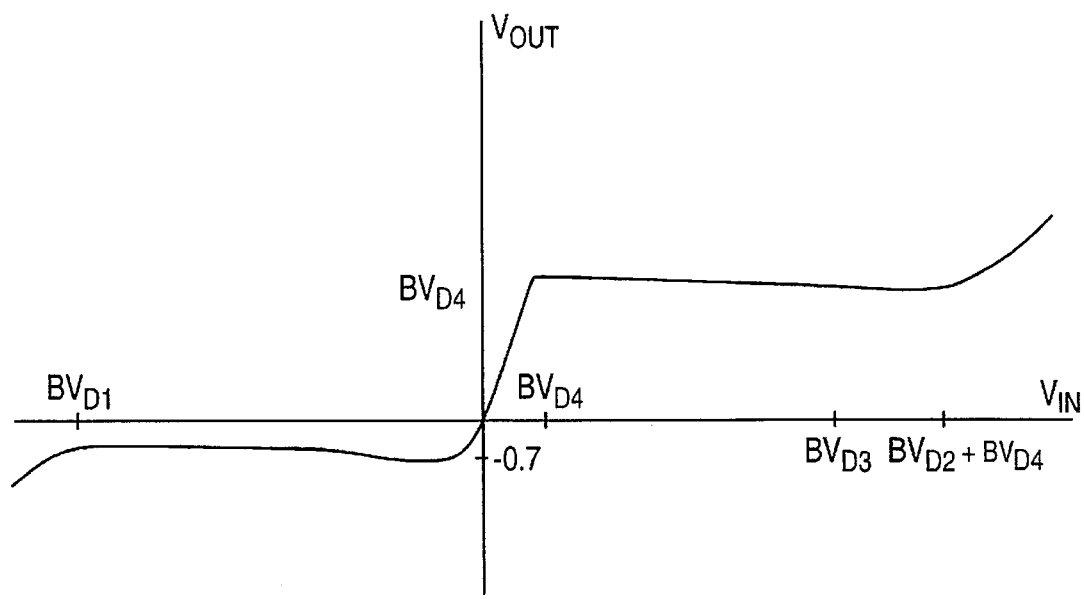
FIGS. 12A and 12B illustrate the overall transfer characteristic of the circuit shown in FIG. 3, FIG. 12A showing the output voltage as a function of the input voltage and FIG. 12B showing the current to ground as a function of the input voltage.
Figure 12B:
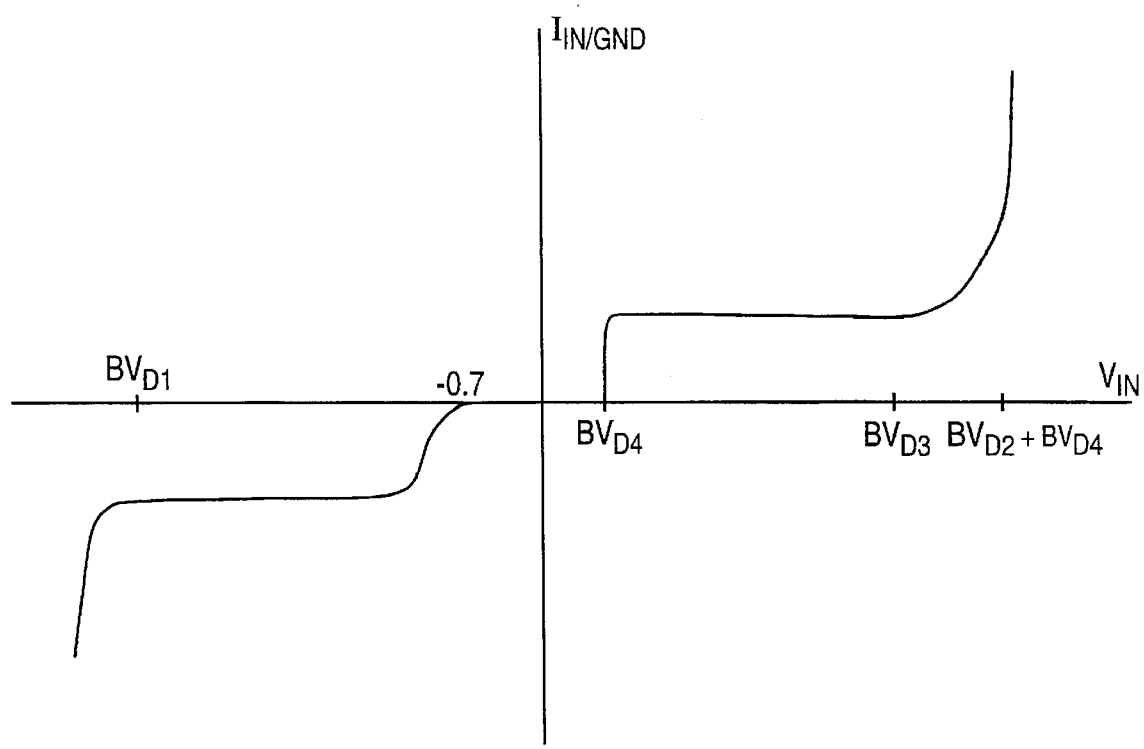
Figure 13:
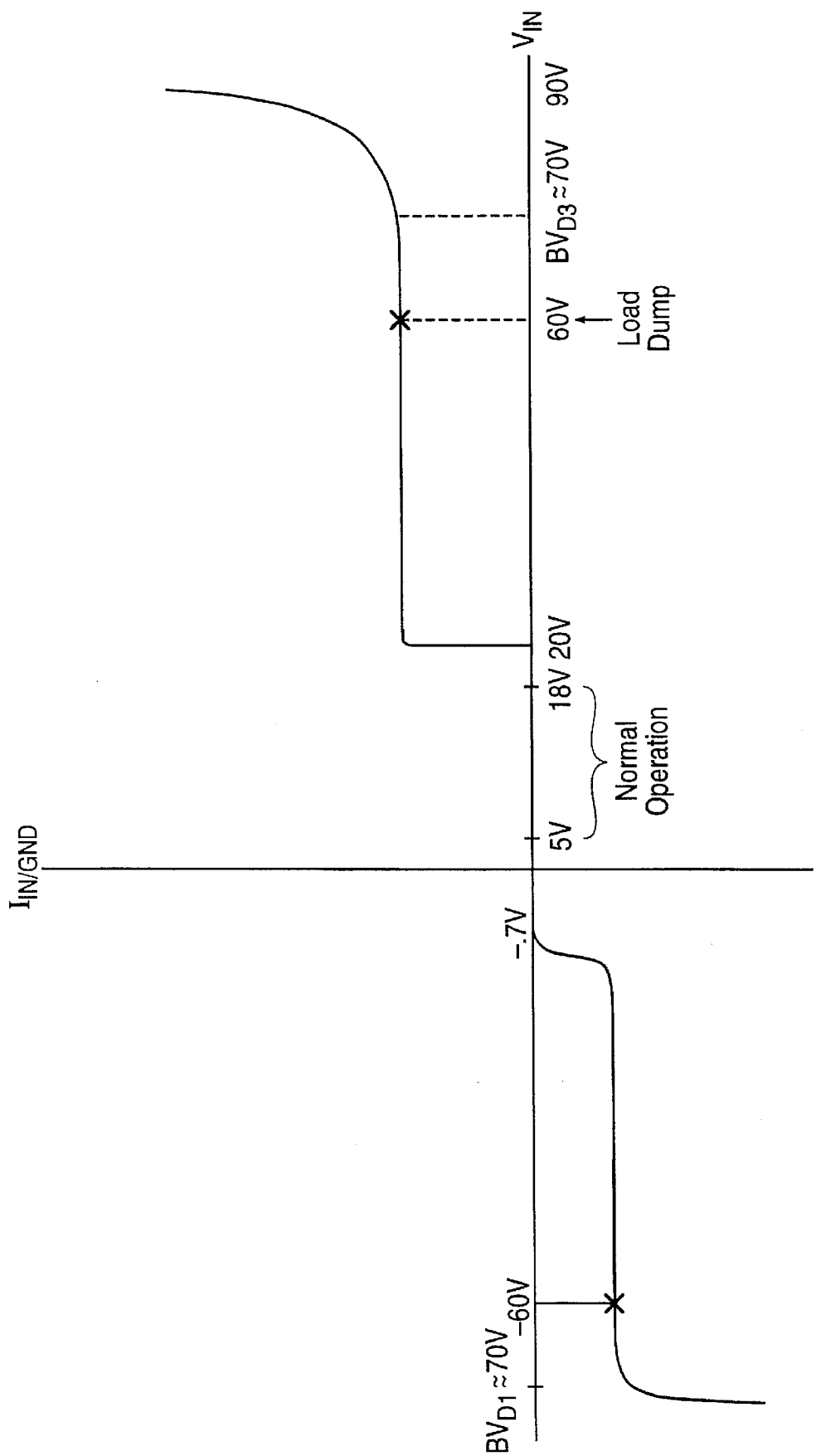
FIG. 13 illustrates representative values for several points on the curve shown in FIG. 12B.

FIGS. 12A and 12B illustrate the overall transfer characteristics of ESD protective circuit 30, FIG. 12A showing $V_{OUT}$ as a function of $V_{IN}$ and FIG. 12B showing the current to ground ($I_{IN/GND}$) as a function of $V_{IN}$. There is a linear relationship between $V_{IN}$ and $V_{OUT}$ in normal operation (for example, from 5V to 18V), and the current is limited for voltages up to approximately 70V in either polarity. The rapid rise in current to ground beyond ±70V is needed to clamp the output voltage during ESD pulses having a very short duration. The current limiting which occurs between ±70V is critical to the ability of circuit 30 to survive high voltage inputs, such as load dump, which have more extended durations. Illustrative values of $V_{IN}$ are shown in FIG. 13, which corresponds to FIG. 12B.

Figure 14:
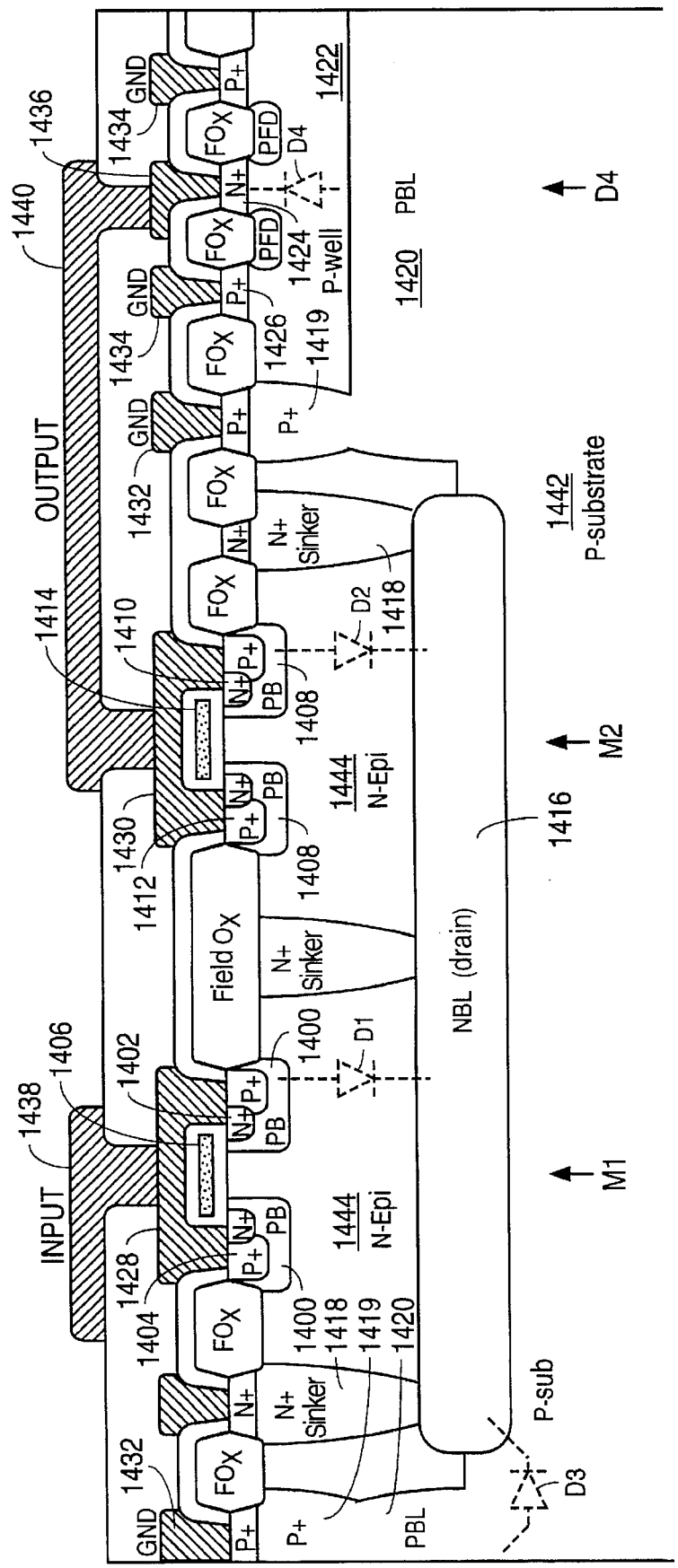
FIG. 14 illustrates a cross-sectional view of an integrated circuit embodying the ESD protective circuit shown in FIG. 3.

The ESD device of this invention may be fabricated in either integrated or discrete form. FIG. 14 illustrates a cross-sectional view of an IC version which uses an N epitaxial layer over a P substrate as the starting point. In FIG. 14, MOSFET $M_1$ includes a P-body (PB) region 1400 which is shorted to an N+ source region 1402 via a P+ contact region 1404, as well as a polysilicon gate 1406. MOSFET $M_2$ includes a P-body (PB) region 1408 which is shorted to an N+ source region 1410 via a P+ contact region 1412, as well as a polysilicon gate 1414. The common drain of MOSFETs $M_1$ and $M_2$ includes an N buried layer (NBL) 1416 and N+ sinker regions 1418. Diode D3 includes a junction between the P substrate and N buried layer 1416 and is connected to ground through a P+ region 1419 and a P buried layer (PBL) 1420. Diode D4 includes a P-well 1422 and an N+ region 1424 and is connected to ground through a P+ region 1426.

A first metal layer forms source/body contacts 1428 and 1430 for MOSFETS $M_1$ and $M_2$, respectively, as well as anode/ground contacts 1432 and 1434 for diodes D3 and D4, respectively, and a cathode contact 1436 for diode D4. A second metal layer includes an input line 1438 and an output line 1440, which ties together the source/body contact 1430 (MOSFET $M_2$ and the anode contact 1436 (diode D4)).

Figure 15:
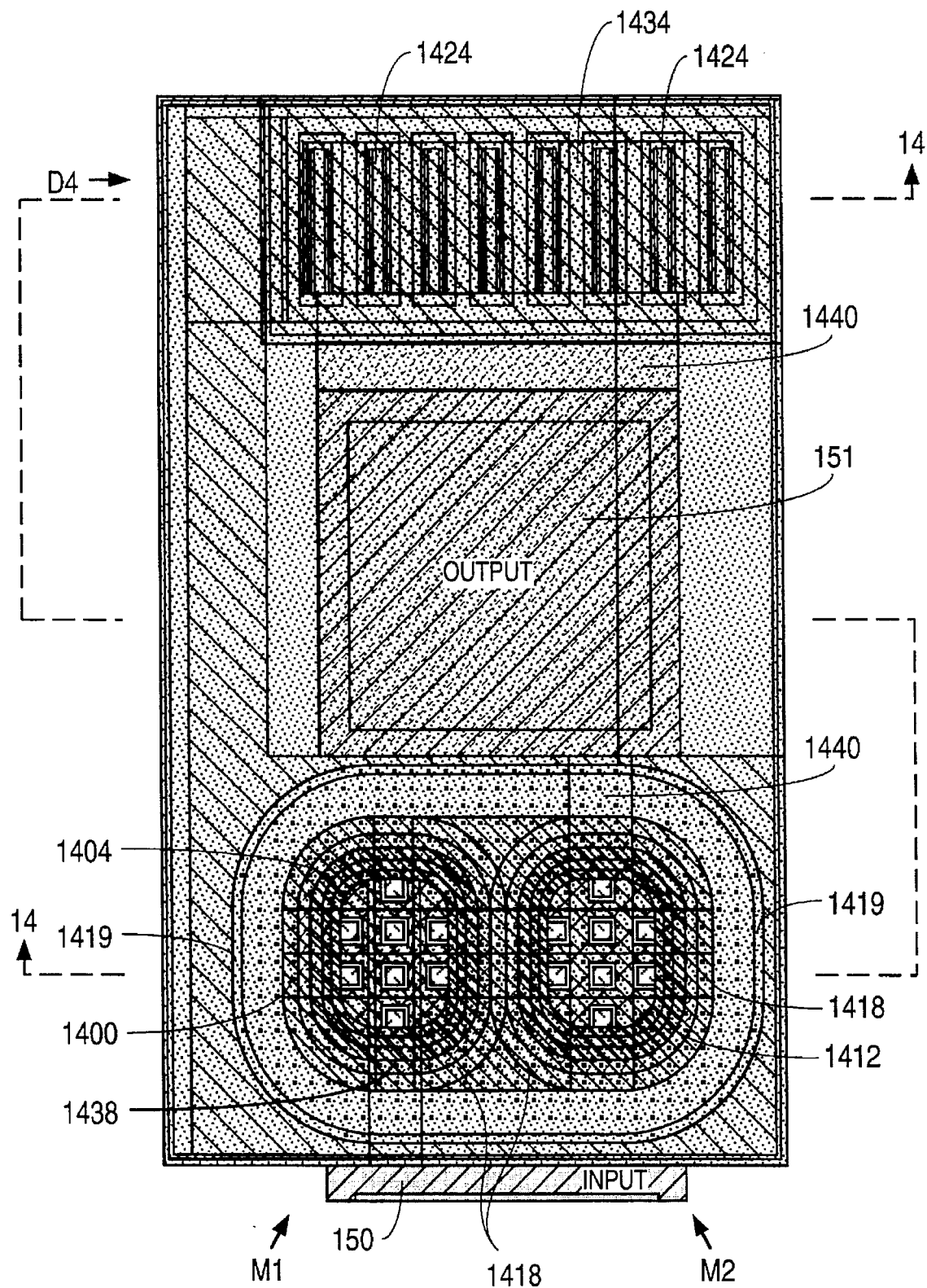
FIG. 15 illustrates a plan view of a modified form of the IC embodiment shown in FIG. 14.

FIG. 15 illustrates a plan view of a modified form of the structure shown in FIG. 14. The two ring-shaped devices represent the depletion mode MOSFETs $M_1$ and $M_2$, while the interdigitated device represents the clamp diode D4. In FIG. 15, each MOSFET comprises an array of DMOS cells (not numbered) with integral source/body shorts and abutting contacts. The polysilicon contact located at the edge of the cell is metallized with the (source/body) first metal layer. The N+ region 1418, which represents the drain connection for MOSFETs $M_1$ and $M_2$, is seen to be in the form of a figure eight, with one of MOSFETs $M_1$ and $M_2$ being enclosed in each loop of the "eight". A larger concentric ring includes deep P+ region 1419. An input pad 150 is connected to input line 1438 and an output pad 151 is connected to output line 1440.

The current flows from input line 1438 and source/body contacts 1428 to N+ source region 1402, across the channel in MOSFET $M_1$ to the drain (N-buried layer 1416, which is not visible in FIG. 15). The current then flows through N-buried layer 1416 from MOSFET $M_1$ to MOSFET $M_2$, through the channel region to N+ source region 1410 of MOSFET $M_2$ and through source/body contacts 1430 to output line 1440.

Diode D4 is seen to be a series of interdigitated N+ cathode regions 1424 and metal ground contacts 1434.

From FIG. 15 it is apparent that the cross-sectional view of FIG. 14 is not taken along a single, linear cross-sectional line. Indeed, the MOSFET pair and diode D4 could be located at various positions with respect to each other on the IC.

The fabrication of this device begins with a P-substrate 1442 in which boron is implanted to form P-buried layer 1420 and antimony or arsenic is implanted to form N-buried layer 1416. An N-type epitaxial layer 1444 is then grown to a thickness of, for example, 0.5 to 6.0 μm. N+ sinker region 1418 is then implanted and driven to a depth of several microns, preferably so that it adjoins N-buried layer 1416. P+ region 1419 is then implanted and a local oxidation of silicon (LOCOS) process is used to form the field oxide regions shown in FIG. 14. A gate oxide is then formed on the surface of N-epitaxial layer 1444 and the gate oxide is masked and doped with cesium to create a fixed positive oxide charge. Polysilicon gates 1406 and 1414 are then formed and doped with N-type ions.

A blanket N-type LDD implant is then carried out in the active device areas. This implant is not shown in FIG. 14 because subsequent diffusions counter-dope and convert this implant. P+ body regions 1404 and 1412 are then implanted and driven in. Then N+ regions 1402 and 1410 and P+ regions 1404 and 1412 are implanted and this is followed by a short drive-in diffusion.

A borophosphosilicate glass layer is then deposited and planarized using a heat treatment. Contacts are then masked and etched and the first metal layer (aluminum copper silicon) is deposited, patterned and etched. This forms metal contacts 1428, 1430, 1432 and 1434 shown in FIG. 14.

An interlayer dielectric (glass) layer is then deposited and planarized. The vias for the second metal layer are patterned and etched. The second metal layer (aluminum copper silicon) is then deposited and etched, forming input line 1438 and output line 1440. Finally, a passivation layer (not shown in FIG. 14) is deposited and contact pads are masked and opened.

The structure and fabrication of the device shown in FIGS. 14 and 15 is further described in Application Ser. No. 07/948,276, filed Sep. 21, 1992, now abandoned, Application Ser. No. 08/026,713, filed Mar. 5, 1993, now abandoned, Application Ser. No. 08/026,930, filed Mar. 5, 1993, now U.S. Pat. No. 5,422,508, issued on Jun. 6, 1995, Application Ser. No. 08/026,932, filed Mar. 5, 1993, now U.S. Pat. No. 5,374,569, issued on Dec. 20, 1994, Application Ser. No. 08/225,270, filed Apr. 8, 1994, now U.S. Pat. No. 5,416,039, issued on May 16, 1995, Application Ser. No. 08/226,419, filed Apr. 11, 1994, now U.S. Pat. No. 5,426,328, issued on Jun. 20, 1995, and Application Ser. No. 08/323,950, filed Oct. 17, 1994, entitled "BiCDMOS Process Technology And Structures", now U.S. Pat. No. 5,559,044, issued on Sep. 24, 1996 all of which are incorporated herein by reference.

Figure 16:
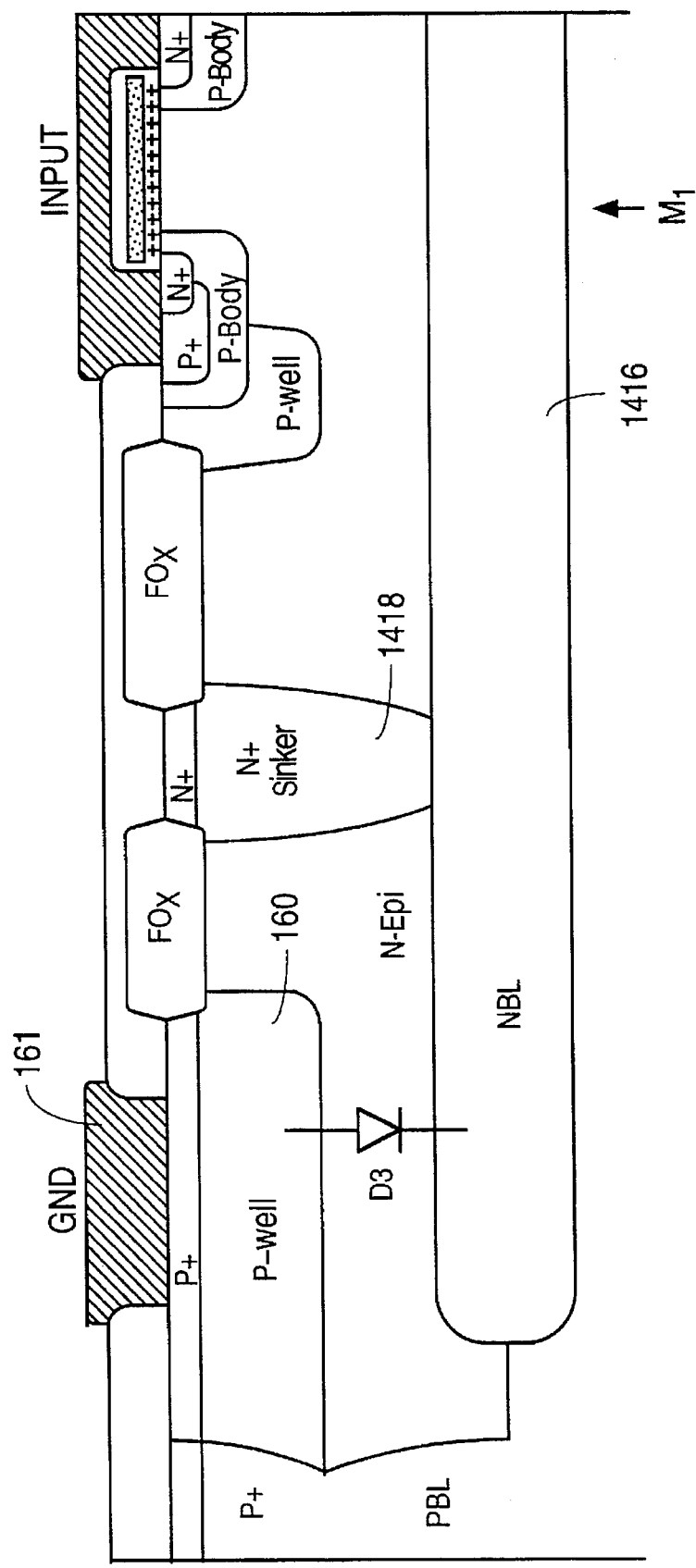
FIG. 16 illustrates a cross-sectional view of a portion of the IC shown in FIG. 14 which has been modified so as to increase the breakdown voltage of one of the MOSFETs.

FIG. 16 illustrates a modification of the structure relating to diode $D_3$ in the device shown in FIGS. 14 and 15. A P well 160 is formed at the surface of the device and is connected to a metal terminal 161, which is grounded. The N buried layer is extended to the left thereby significantly increasing the area of diode $D_3$. The use of the additional P well at the junction termination edge increases the breakdown voltage of the MOSFET $M_1$. The gate oxide of MOSFET $M_1$ is shown as having a positive charge (from a cesium implant, for example) to make MOSFET $M_1$ depletion mode.

Figure 17:
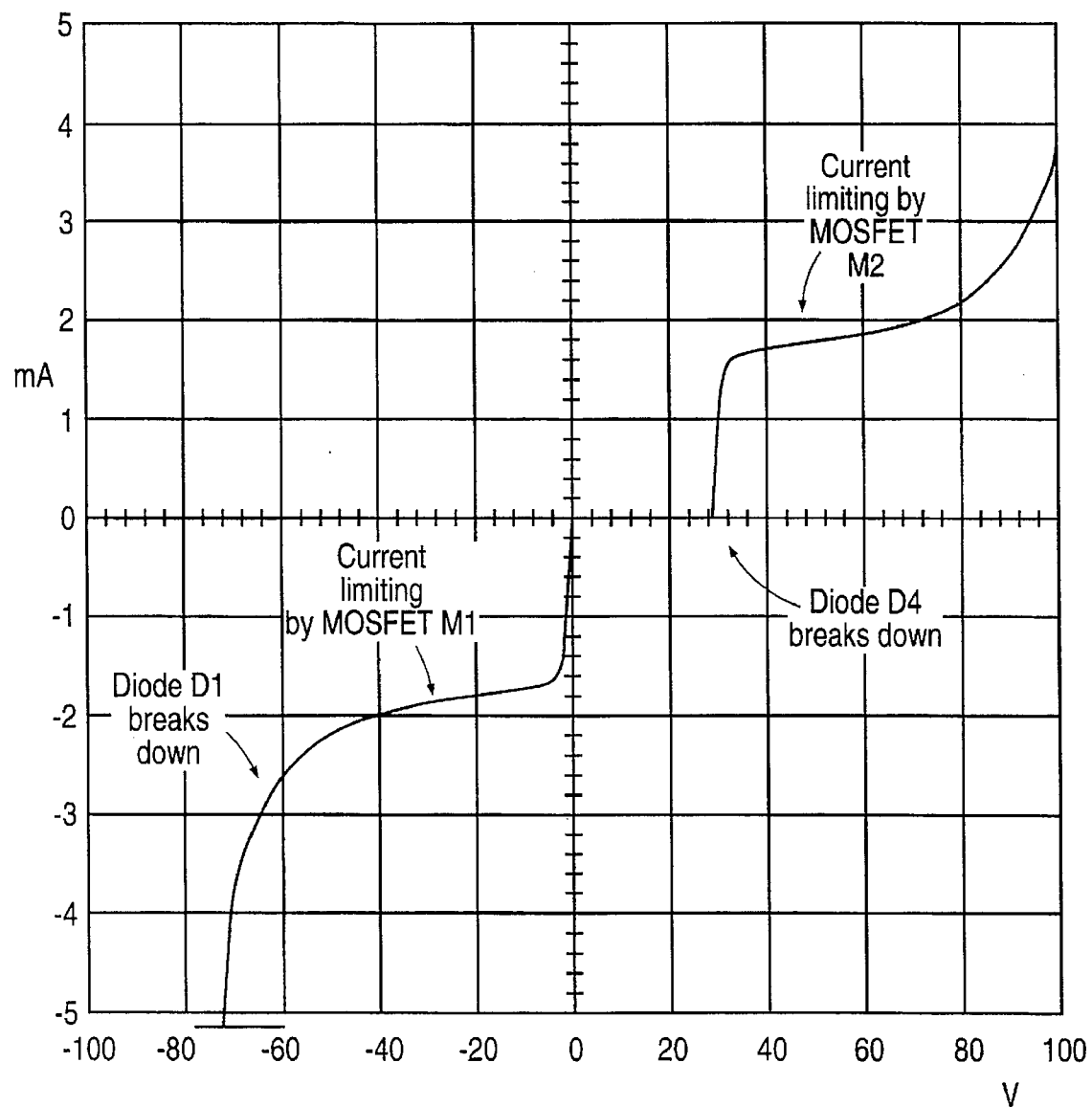
FIG. 17 illustrates the measured current-voltage transfer characteristics of an ESD device in accordance with this invention.

FIG. 17 illustrates the experimentally determined current-to-ground versus voltage characteristics of an ESD protection device according to this invention. In the device tested, the breakdown voltage of diode $D_4$ was 30V, which is somewhat higher than it would normally be.

Figure 18:
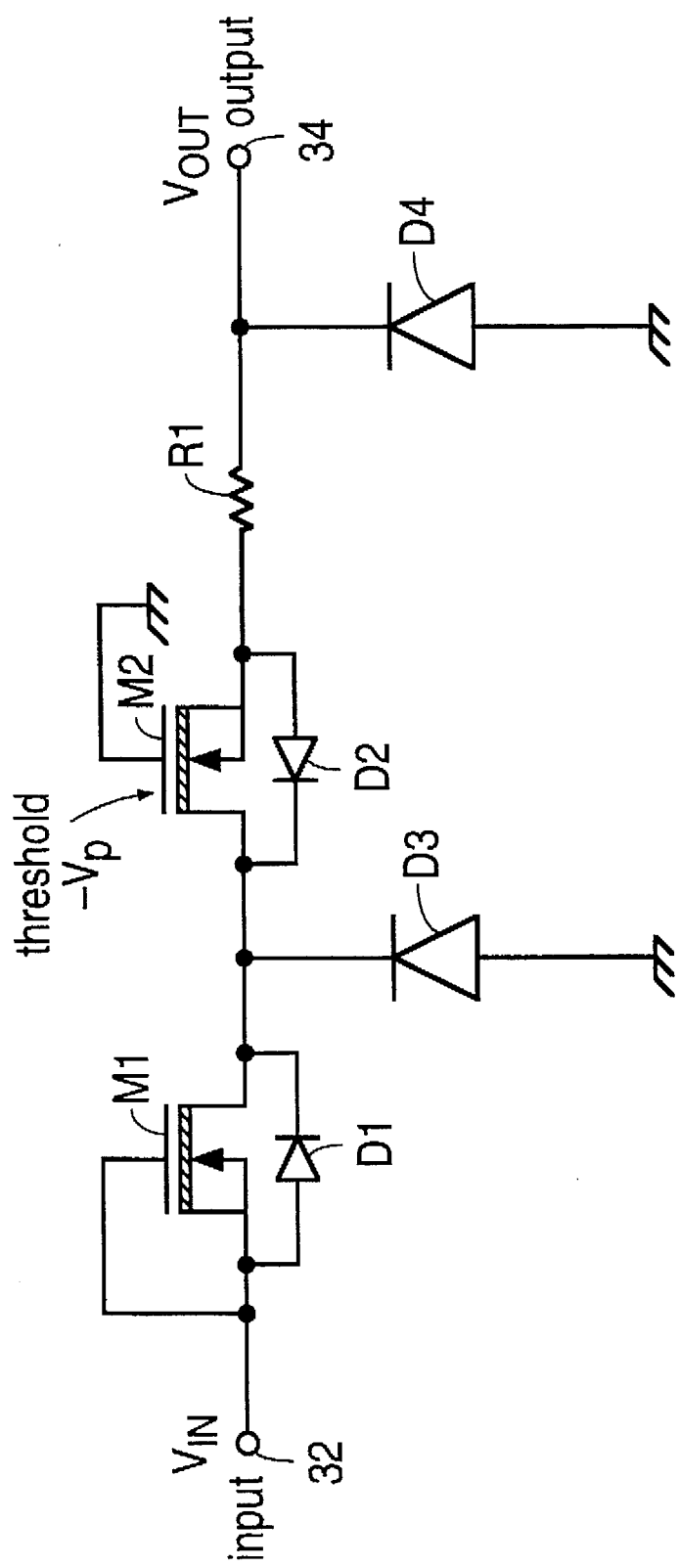
FIG. 18 illustrates an alternative embodiment according to the invention, in which the gate of one of the depletion mode MOSFETs is grounded.

FIG. 18 illustrates an alternative embodiment of an ESD device according to this invention. The similarly numbered components are similar to those shown in FIG. 3, but the gate terminal of depletion mode MOSFET $M_2$ is grounded rather than connected to its source terminal. MOSFET $M_2$ operates as a source follower, and pinch-off occurs when the voltage at its source reaches a level equal to $V_P$ above the gate voltage (ground). At this point, MOSFET $M_2$ is turned off, and thus $V_{OUT}$ cannot exceed $V_P$. Provided that $V_P$ is less than $BV_{D4}$, then $V_{OUT}$ is clamped to $V_P$ rather than $BV_{D4}$ and diode $D_4$ could be eliminated. In practice, however, it may be desirable to retain diode $D_4$ as a back-up.

Figure 18A:
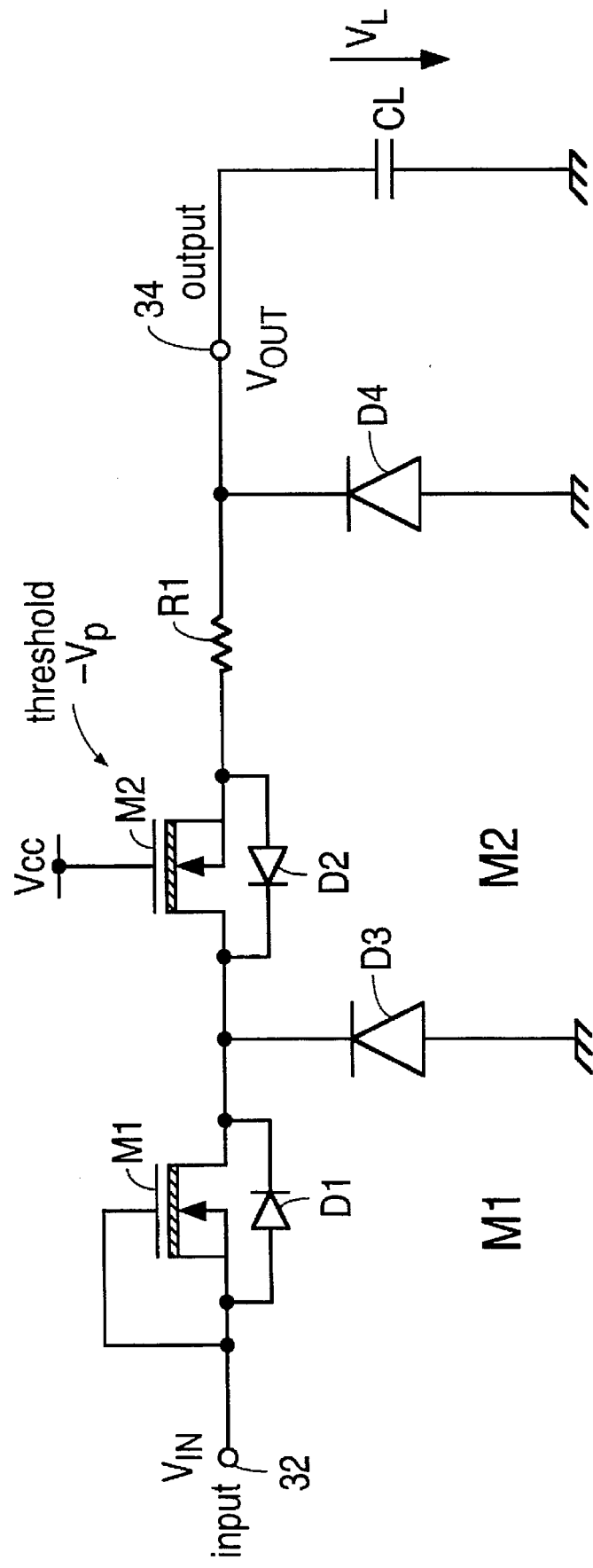
FIG. 18A illustrates a modification of the embodiment shown in FIG. 18.

FIG. 18A shows a modified version of the embodiment shown in FIG. 18. In the version of FIG. 18A, the gate of MOSFET $M_2$ is connected to the internal supply voltage $V_{CC}$. At low values of $V_{OUT}$, MOSFET $M_2$ acts as a source follower and pinch-off will not occur until $V_{OUT}$ reaches $V_{CC}+V_P$. The normal on-resistance of MOSFET $M_2$ is much lower than in the circuits shown in FIGS. 3 and 18. If the load is assumed to contain a capacitor $C_L$, the time to charge the load capacitor $C_L$ can be significantly reduced. The input voltage $V_{IN}$ is assured of reaching the internal supply rails independent of the MOSFET threshold voltage because of the enhancement which results from biasing the gate of MOSFET $M_2$ to $V_{CC}$. If the breakdown voltage of diode D4 is greater than $V_{CC}$, the gate-to-source voltage $V_{GS}$ of MOSFET $M_2$ will become negative under a load dump condition. The input current then will be smaller than in the circuit shown in FIG. 3. If the breakdown voltage of diode D4 is greater than $V_{CC}+V_P$, the input current will be reduced to virtually zero.

Figure 19:
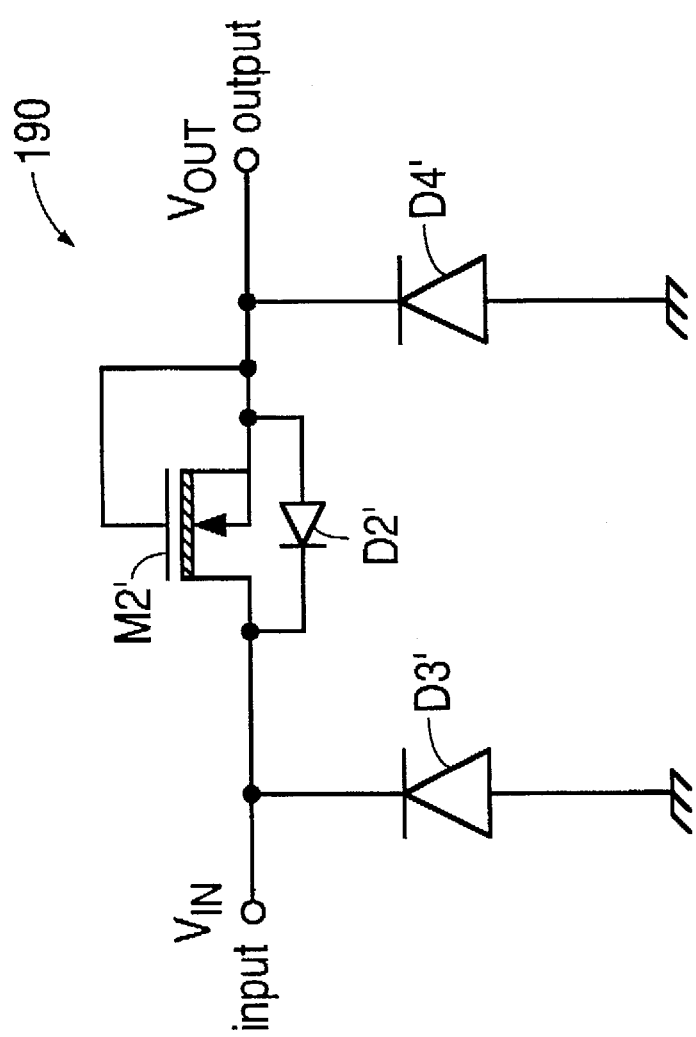
FIG. 19 illustrates a second alternative embodiment according to the invention, in which one of the depletion mode MOSFETs is omitted.

FIG. 19 illustrates a second alternative embodiment which omits MOSFET $M_1$. ESD protection circuit 190 protects against positive voltage spikes by using a MOSFET $M_2'$ as a constant current source in the manner described above. The equivalent circuit for this embodiment is similar to the circuits shown in FIGS. 4A, 6A, 7A and 8A, but without resistance $R_{M1}$ or diode $D_1$. For negative going transients, this embodiment relies on the forward-biasing of diode $D_3$ but, because MOSFET $M_1$ is missing, the current is not limited in this situation. Thus ESD protection circuit 190 does not protect against negative transients of significant duration, such as a negative input voltage caused by a reversed battery in an automobile.

Figure 20:
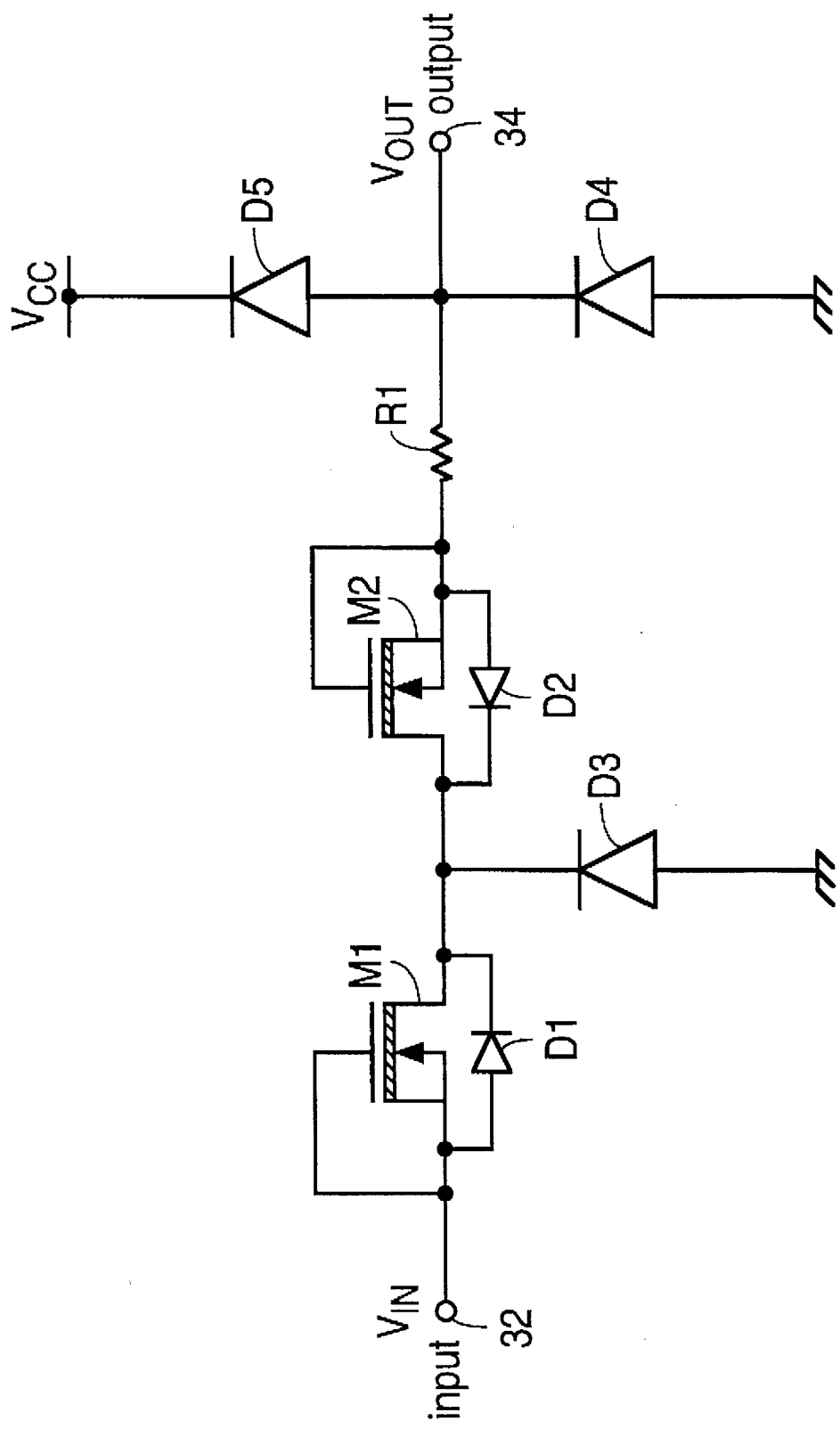
FIG. 20 illustrates another alternative embodiment according to the invention in which a diode is connected between the output terminal and the supply voltage.

The foregoing discussion has focused on positive or negative voltage spikes which occur on a signal input line. FIG. 20 illustrates an ESD device which is similar to the ESD device of FIG. 3 except that a diode $D_5$ is connected between output 34 and the supply voltage $V_{CC}$. While this arrangement may help with voltage spikes that occur between $V_{CC}$ and the signal input terminal, it suffers from the possible disadvantage that diode $D_5$ may become forward-biased if the supply voltage $V_{CC}$ fails, in which case $V_{IN}$ will attempt to power the adjacent IC device.

Figure 21:
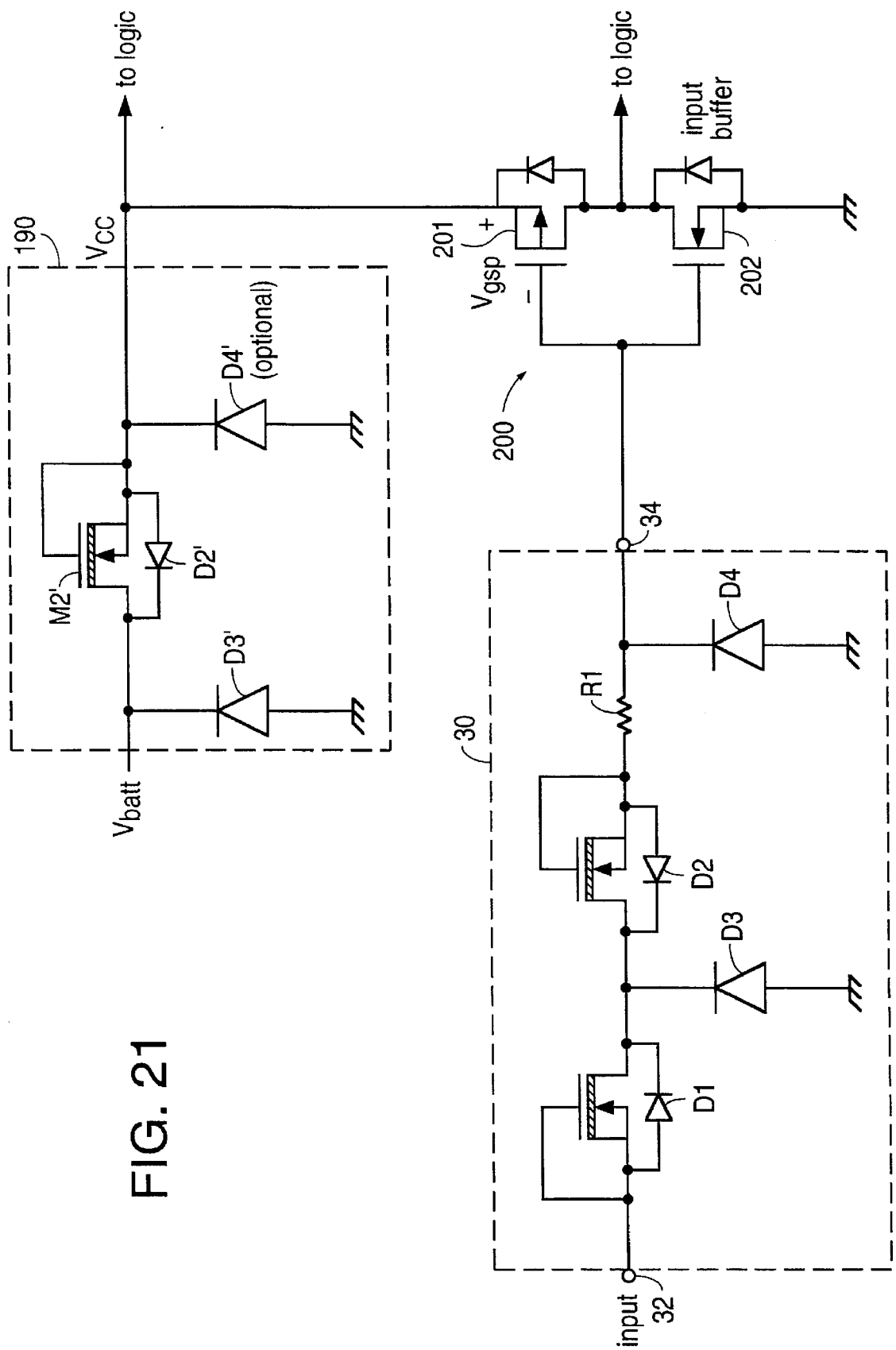
FIG. 21 illustrates an arrangement in which the ESD protection circuit of FIG. 3 is connected to an input pin and the ESD protection circuit of FIG. 19 is connected to the power supply pin of an IC device.

A better solution to voltage spikes on the supply rail is illustrated in FIG. 21 wherein the signal input terminal contains ESD protection circuit 30 and the supply rail $V_{CC}$ is connected to a battery or other source of power through ESD protection circuit 190. Also shown is a CMOS input buffer 200, containing a PMOS transistor 201 and an NMOS transistor 202, which delivers the input signal to logic inside the IC device. This arrangement provides protection for all combinations of voltage spikes occurring between the power supply, ground and signal inputs. With this arrangement, the maximum voltage that can occur across the gate oxide of PMOS transistor 201 is limited to $BV_{D4}$.

Figure 22:
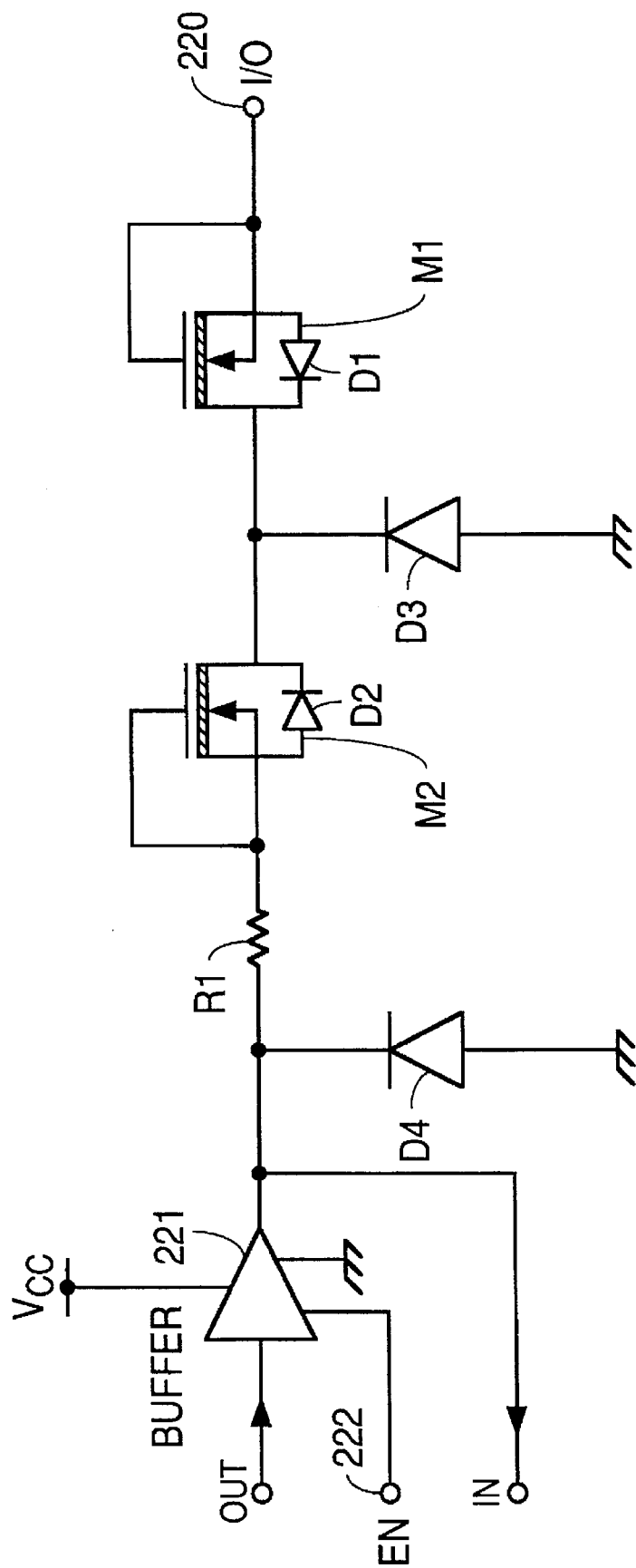
FIG. 22 illustrates an embodiment according to the invention used with an input/output terminal.

A circuit according to this invention can be used for the protection of output terminals and combination input/output (I/O) terminals as well as for the protection of input terminals. FIG. 22 illustrates the circuit of FIG. 3 connected to an I/O terminal 220. A tri-state (high, low or floating) buffer 221, controlled by an enable terminal 222, regulates whether I/O terminal 220 is in the input or output mode. The operation of the protective circuit shown in FIG. 22 is the same as that described above in connection with FIG. 3. In addition, all of the modifications described above can be applied to the circuit shown in FIG. 22.

If MOSFETs $M_1$ and $M_2$ in FIG. 22 are properly sized to handle the current set by the value of resistor R1, the protective circuit can also provide a current-limiting function in the event of a short circuit condition. As in the case of a load dump, the dynamic performance of the circuit is superior to a simple resistive short-circuit protective arrangement. The circuit also protects the output driver from excess currents caused by short circuits to a supply voltage beyond the internal supply voltage.

Figure 23:
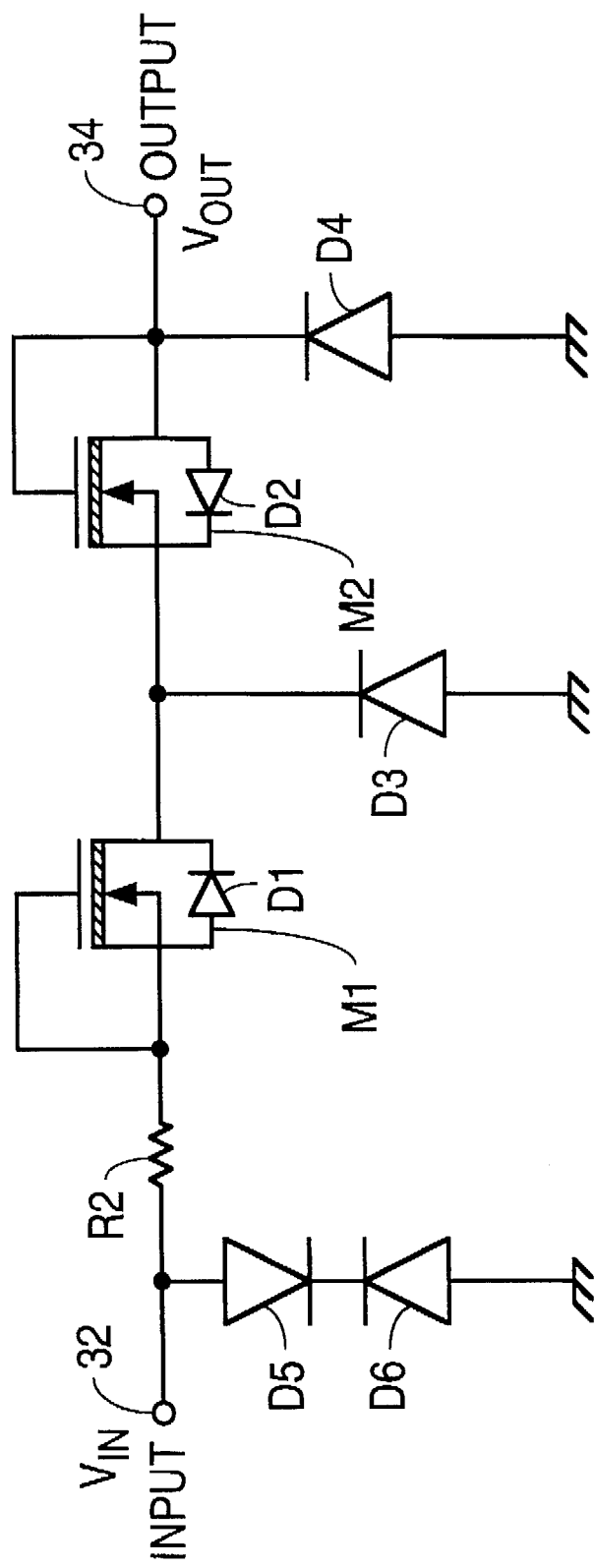
FIG. 23 illustrates an embodiment according to the invention in combination with a separate ESD protection circuit.

Moreover, an additional input clamp can be used to protect against ESD spikes. For example, as shown in FIG. 23, diodes D5 and D6 are connected back-to-back between input terminal 32 and ground. In this arrangement, protection against ESD and load dumps, respectively, can be designed independently. This offers an additional degree of freedom to optimize the behavior of the circuit during normal operation and load dump. For example, it is possible to design for a specific load dump current.

The breakdown voltage of each of diodes D5 and D6 should be no greater than the breakdown voltage of diodes D1 and D3. When $V_{IN}$ is below the breakdown voltage of diodes D5 and D6, the circuit works as described above. When $V_{IN}$ exceeds the breakdown voltage of diode D5 or D6, a low resistance path to ground is formed through these diodes, limiting $V_{IN}$ to a value that is determined by the series resistance of diodes D5 and D6. If $V_{IN}$ is still below the breakdown voltage of diodes D2 and D3 (assuming $V_{IN}>0$) the current in MOSFET $M_1$ will be the saturation current of MOSFET $M_1$. If $V_{IN}$ is a negative voltage which is below the breakdown voltage of diode D1, the current in MOSFET $M_1$ will be the saturation current of MOSFET $M_2$ plus a current determined by the on-resistance of diode D3.

If the breakdown voltages of diodes D2 and D6 are equal and the ESD voltage is positive, diode D1 will be forward-biased and the reverse voltage across diode D2 will be reduced by the breakdown voltage of diode D4. Due to the exponential voltage dependence of avalanche breakdown, the current density in diode D2 will be significantly smaller than in diodes D5 and D6. In the case of equal breakdown voltages of diodes D1 and D5 and a negative ESD voltage, the current into MOSFET $M_1$ will be limited by the area ratio and parasitic resistances present in the circuit. Adding a resistor R2 can help to control the current distribution. In any event, the major ESD current will flow in diodes D5 and D6, thus bypassing MOSFETs $M_1$ and $M_2$.

Figure 24:
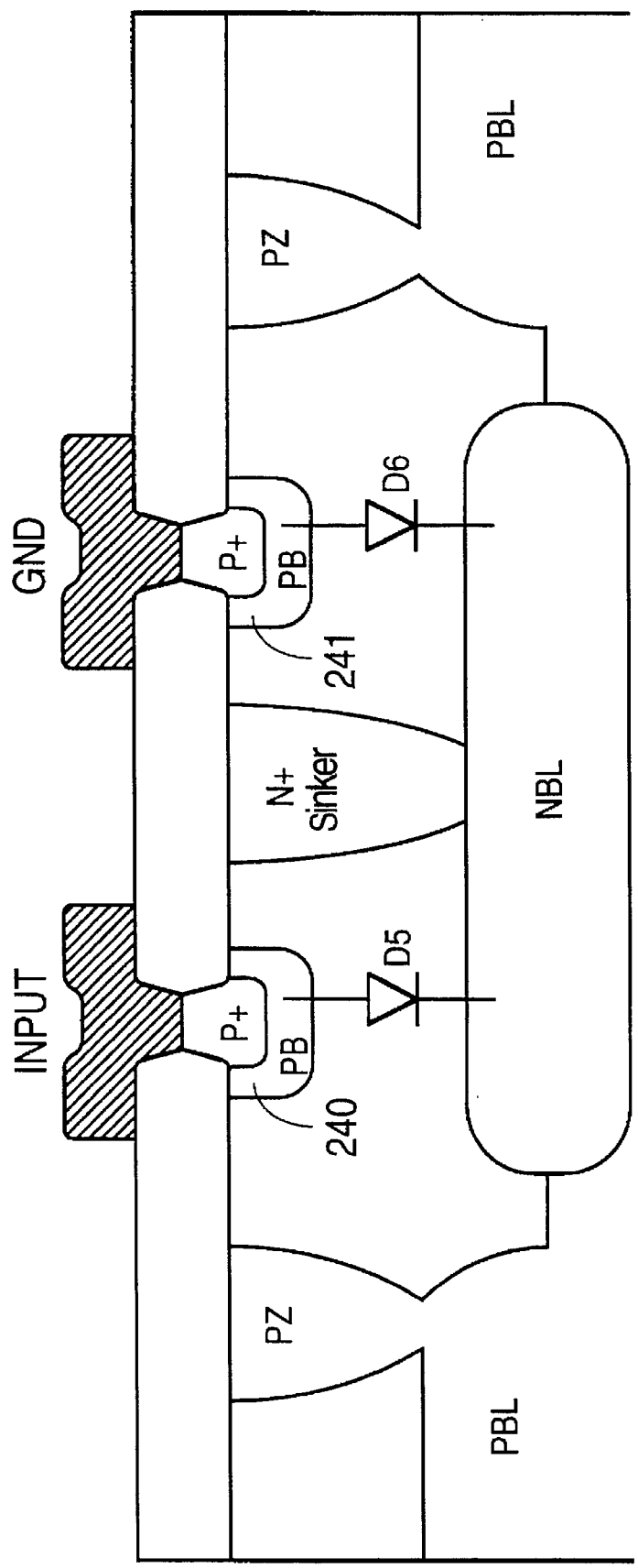
FIG. 24 illustrates a cross-sectional view of an integrated circuit embodying the separate ESD protection circuit of FIG. 23.

FIG. 24 illustrates a cross-sectional view of a monolithic integration of diodes D5 and D6. The anodes of diodes D5 and D6, shown as P body regions 240 and 241, can be formed in the same diffusion process as the drain-to-body diodes of MOSFETs $M_1$ and $M_2$, shown as P body regions 140, 141, 142 and 143 in FIG. 14. This provides good matching of the respective breakdown voltages of diodes D1, D2, D5 and D6. Diode D3 does not have to be an explicit device. Instead, its function can be taken over by the parasitic drain-to-substrate diode of MOSFETs $M_1$ and $M_2$.

While specific examples according to the invention have been described, numerous alternative embodiments will be apparent to those skilled in the art, all of which are intended to be within the broad scope of this invention.

We claim:

1. An ESD protection arrangement comprising an IC device and first and second ESD protection circuits, each of said ESD protection circuits comprising two depletion mode MOSFETs connected in series drain-to-drain between an input terminal and an output terminal of said circuit, each of said MOSFETs having a gate, a body and a source shorted together, a common node between said MOSFETs being connected to ground through a first diode a source terminal of one of said MOSFETs being connected through a series resistor to said output terminal and to a cathode of a second diode, an anode of said second diode being connected to ground, the output terminal of said first ESD protection circuit being coupled to internal circuitry of the IC device, the output terminal of said second ESD protection circuit being coupled to a power supply rail of said IC device.

2. An ESD protection arrangement comprising an IC device and first and second ESD protection circuits the first ESD protection circuit comprising first and second depletion mode MOSFETs connected in series drain-to-drain between an input terminal and an output terminal of the first ESD protection circuit, each of said first and second MOSFETs having a gate, a body and a source shorted together, a common node between said first and second MOSFETs being connected to ground through a first diode a source terminal of said second MOSFET being connected through a series resistor to the output terminal of the first ESD protection circuit the output terminal of said first ESD protection circuit being coupled to internal circuitry of the IC device, said second ESD protection circuit comprising a third depletion mode MOSFET connected between an input terminal and an output terminal of said second ESD protection circuit, said third MOSFET having a gate, a body and a source shorted together, a drain of said third MOSFET being connected to ground through a second diode a source terminal of said third MOSFET being connected to an output terminal of said second ESD protection circuit, the output terminal of said second ESD protection circuit being coupled to a power supply rail of said IC device.

3. An ESD protection circuit for protecting internal circuitry of an IC device, said circuit comprising an input terminal, an output terminal to be connected to the IC device, a depletion mode MOSFET, said MOSFET having a gate, a body and a source shorted together, and a drain connected to ground through a first diode a source terminal of said MOSFET being connected to the output terminal of said ESD protection circuit and through a series resistor to a cathode of a second diode, an anode of said second diode being connected to ground.

4. The ESD protection circuit of claim 3 wherein said first and second MOSFETs are formed in a tub formed in an N-type epitaxial layer.

5. The ESD protection circuit of claim 4 wherein said MOSFETs are separated by and surrounded by a heavily-doped diffusion of N-type semiconductor material which extends between a surface of said N-type epitaxial layer and an N-type buried layer.

6. The ESD protection arrangement of claims 1 wherein the first diode has a breakdown voltage comparable to a breakdown voltage of each of said MOSFETs.

7. The ESD protection arrangement of claim 2 wherein the first diode has a breakdown voltage comparable to a breakdown voltage of each of said first and second MOSFETs of the first ESD protection circuit and the second diode has a breakdown voltage comparable to a breakdown voltage of the third MOSFET.

8. The ESD protection arrangement of claim 2 wherein the second ESD protection circuit further comprises a third diode, a cathode of the third diode being connected to the source terminal of the third MOSFET, and an anode of the third diode being connected to ground.

9. The ESD protection arrangement of claims 8 further comprising a CMOS input buffer, the CMOS input buffer being connected between the output terminal of the first ESD protection circuit and the internal circuitry of the IC device, the CMOS input buffer containing a PMOS transistor and an NMOS transistor, the PMOS transistor and the NMOS transistor being connected in series between the power supply rail and ground, respective gate terminals of the PMOS transistor and the NMOS transistor being connected to the output terminal of the first ESD protection circuit, a common drain node of the PMOS transistor and the NMOS transistor being connected to the internal circuitry of the IC device.

10. The ESD protection arrangement of claim 2 wherein the first ESD protection circuit further comprises a third diode, a cathode of the third diode being connected to the output terminal of the first ESD protection circuit, and an anode of the third diode being connected to ground.

11. The ESD protection circuit of claim 3 wherein the first diode has a breakdown voltage comparable to a breakdown voltage of said MOSFET.

12. An ESD protection arrangement comprising an IC device and an ESD protection circuit wherein the ESD protection circuit comprises two depletion mode N-channel MOSFETs connected in series drain-to-drain between a tri-state buffer and an input/output terminal of the IC device, each of said MOSFETs having a gate, a body and a source shorted together, a common node between said MOSFETs being connected to ground through a first diode, a source terminal of one of said MOSFETs being connected through a series resistor to the tri-state buffer and to a cathode of a second diode, an anode of the second diode being connected to ground.

13. The ESD protection arrangement of claim 11 wherein the first diode has a breakdown voltage comparable to a breakdown voltage of each of said MOSFETs.

14. The ESD protection arrangement of claim 2 wherein said first MOSFET in said first ESD protection circuit is connected through a second series resistor to the input terminal of the first ESD protection circuit and through said second series resistor and a series combination of fifth and sixth diodes to ground, said fifth and sixth diodes being connected with opposed polarities in said series combination.

15. An ESD protection circuit comprising an input terminal, an output terminal, a depletion mode MOSFET connected between said input terminal and said output terminal, the source, body and gate of said MOSFET being shorted together and connected to said output terminal, a first diode having a cathode connected to a drain of said MOSFET and an anode connected to ground, and a second diode having a cathode connected to the output terminal and an anode connected to ground.

16. The circuit of claim 15 wherein a breakdown voltage of the first diode is greater than a breakdown voltage of the second diode.

17. The circuit of claim 15 wherein the first diode has a breakdown voltage of approximately 70V.

18. The circuit of claim 15 wherein the second diode has a breakdown voltage in the range of from 20V to 25V.

19. The circuit of claim 15 wherein the output terminal is connected to an IC device and the second diode has a breakdown voltage which is greater than a maximum allowed signal input voltage to the IC device.

20. The circuit of claim 15 wherein the output terminal is connected to an IC device containing a logic MOSFET and the second diode has a breakdown voltage which is approximately equal to 50% of a gate oxide rupture voltage of the logic MOSFET.

21. The circuit of claim 15 wherein the depletion mode MOSFET is double-diffused.

22. The circuit of claim 15 wherein the MOSFET has a resistance of between 20 and 2000 ohms.

23. The circuit of claim 15 further comprising a series resistance connected between the output terminal and the source/body terminal of the depletion mode MOSFET.

24. The circuit of claim 23 wherein the series resistor has a resistance in the range of from 20 to 2000 ohms.

25. The circuit of claim 15 wherein the circuit is included in an IC.

26. The circuit of claim 15 wherein the circuit is included in an IC formed using a junction isolated process on an N-type epitaxial layer grown on a P-type substrate.

* * * * *